(12) United States Patent
Hotta et al.

(10) Patent No.: US 8,524,607 B2
(45) Date of Patent: Sep. 3, 2013

(54) ANISOTROPICALLY CONDUCTIVE MEMBER AND METHOD OF MANUFACTURE

(75) Inventors: Yoshinori Hotta, Aichi (JP); Takashi Touma, Tokyo (JP); Yusuke Hatanaka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/295,871

(22) Filed: Nov. 14, 2011

(65) Prior Publication Data

US 2012/0055799 A1 Mar. 8, 2012

Related U.S. Application Data

(62) Division of application No. 12/056,336, filed on Mar. 27, 2008, now abandoned.

(30) Foreign Application Priority Data

Mar. 27, 2007 (JP) ................... 2007-082190
Dec. 10, 2007 (JP) ................... 2007-318661

(51) Int. Cl.
*H01L 23/48* (2006.01)
*H01L 21/44* (2006.01)

(52) U.S. Cl.
USPC ........... 438/704; 438/707; 438/708; 438/720; 257/775; 257/200; 257/E21.514; 257/E23.06

(58) Field of Classification Search
USPC ............... 438/704, 707.708, 720; 257/775, 257/200, E21.514, E23.06
See application file for complete search history.

(56) References Cited

U.S. PATENT DOCUMENTS

| 5,262,226 | A | * | 11/1993 | Yoshida | ............... 428/209 |
| 5,379,515 | A | | 1/1995 | Kondo et al. | |
| 6,139,713 | A | | 10/2000 | Masuda et al. | |
| 6,410,859 | B1 | * | 6/2002 | King | ............... 174/260 |
| 2001/0010973 | A1 | | 8/2001 | Aiba et al. | |

(Continued)

FOREIGN PATENT DOCUMENTS

| EP | 1612891 A1 | 1/2006 |
| GB | 1203089 A | 8/1970 |

(Continued)

OTHER PUBLICATIONS

Notice of Reasons for Refusal, dated Dec. 13, 2011, issued in corresponding JP Application No. 2007-318661, 5 pages in English and Japanese.

(Continued)

*Primary Examiner* — Cuong Q Nguyen
*Assistant Examiner* — Cathy N Lam
(74) *Attorney, Agent, or Firm* — Sughrue Mion, PLLC

(57) ABSTRACT

An anisotropically conductive member has an insulating base material, and conductive paths composed of a conductive material which pass in a mutually insulated state through the insulating base material in a thickness direction thereof and which are provided in such a way that a first end of each conductive path is exposed on a first side of the insulating base material and a second end of each conductive path is exposed on a second side of the insulating base material. The conductive paths have a density of at least 2 million paths/mm$^2$ and the insulating base material is a structure composed of an anodized aluminum film having micropores therein.

5 Claims, 9 Drawing Sheets

(56) References Cited

U.S. PATENT DOCUMENTS

Figure 1A:
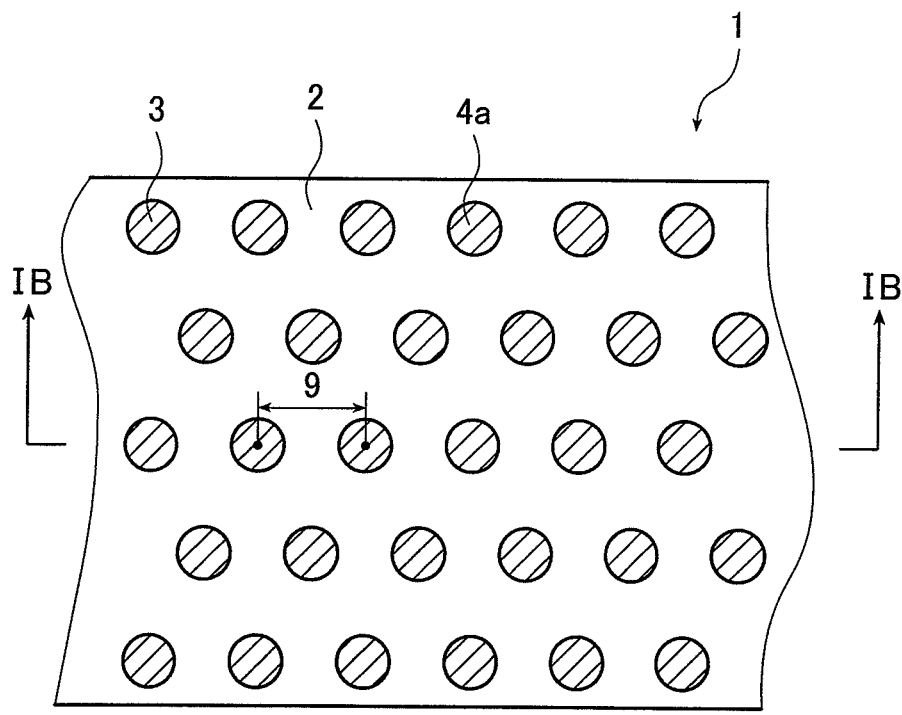

| | | |
|---|---|---|
| 2005/0077542 A1 | 4/2005 | Asai et al. |
| 2006/0234396 A1 * | 10/2006 | Tomita et al. ............ 438/3 |
| 2007/0159698 A1 | 7/2007 | Taguchi et al. |

FOREIGN PATENT DOCUMENTS

| | | |
|---|---|---|
| JP | 3-182081 A | 6/1991 |
| JP | 03-285211 A | 12/1991 |
| JP | 03-285212 A | 12/1991 |
| JP | 03-289010 A | 12/1991 |
| JP | 3034282 U | 11/1996 |
| JP | 10-050145 A | 2/1998 |
| JP | 10-121292 A | 5/1998 |
| JP | 2000-012619 | 1/2000 |
| JP | 2001-105400 A | 4/2001 |
| JP | 2002-134570 A | 5/2002 |
| JP | 2003-129288 A | 5/2003 |
| JP | 2004-217961 A | 8/2004 |
| JP | 2005-85634 A | 3/2005 |
| JP | 2006-326724 A | 12/2006 |

OTHER PUBLICATIONS

Notice of Reasons for Refusal, dated Dec. 13, 2011, issued in related JP Application No. 2007-318046, 6 pages in English and Japanese.

* cited by examiner 102 101

106 104 105

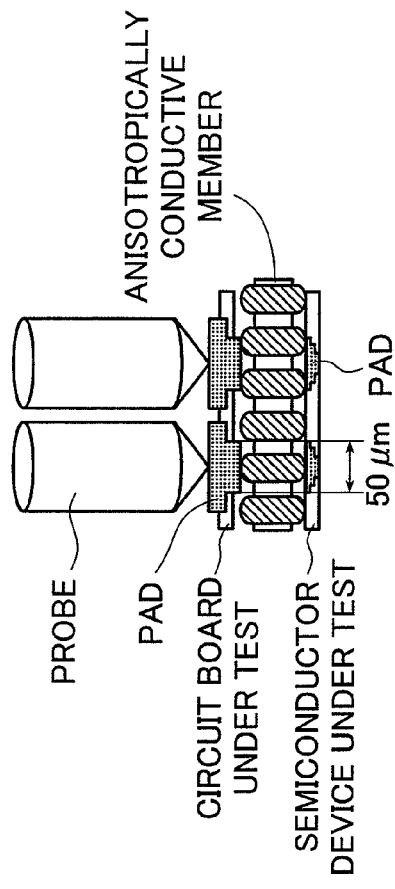
FIG. 7A MEASUREMENT EXAMPLE I
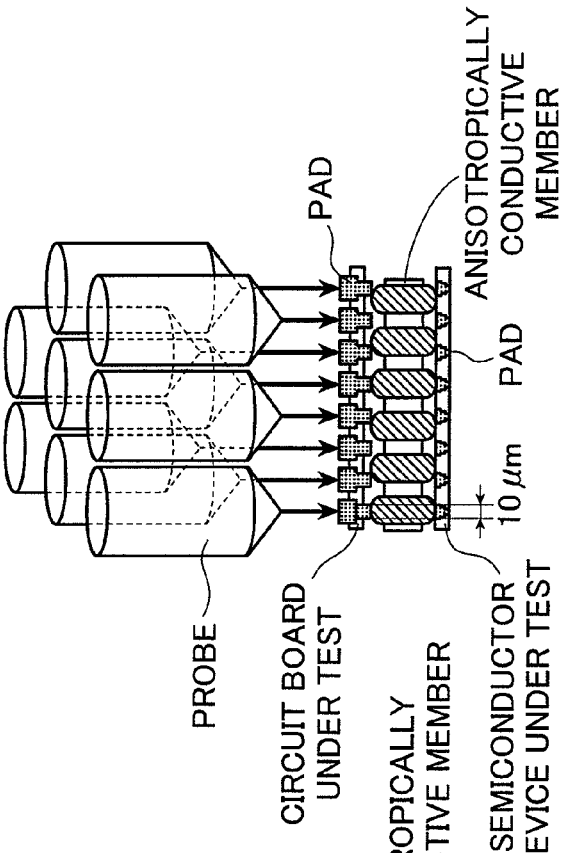
FIG. 7B MEASUREMENT EXAMPLE II
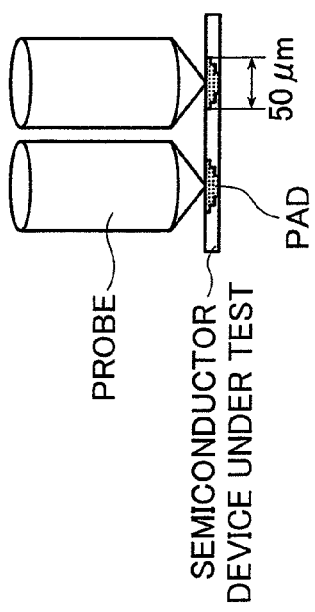
FIG. 7C MEASUREMENT EXAMPLE III
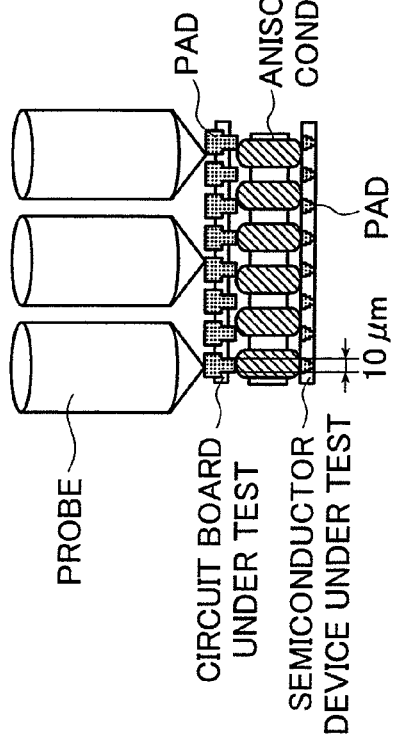
FIG. 7D MEASUREMENT EXAMPLE IV

ANISOTROPICALLY CONDUCTIVE MEMBER AND METHOD OF MANUFACTURE

CROSS RELATED REFERENCE TO RELATED APPLICATIONS

This is a Divisional of U.S. application Ser. No. 12/056,336 filed Mar. 27, 2008 which claims priority from Japanese Patent Application Nos. 2007-082190 and 2007-318661 filed Mar. 27, 2007 and Dec. 10, 2007, respectively. The entire contents of all documents cited in this specification are incorporated herein by reference.

BACKGROUND OF THE INVENTION

The present invention relates to an anisotropically conductive member. The invention relates further to a method of manufacturing such a member.

An anisotropically conductive member, when inserted between an electronic component such as a semiconductor device and a circuit board, then subjected to merely the application of pressure, is able to provide an electrical connection between the electronic component and the circuit board. Accordingly, such members are widely used, for example, as electrically connecting members for semiconductor devices and other electronic components, and as inspection connectors when carrying out functional inspections.

In particular, owing to the remarkable degree of miniaturization that has occurred in electrically connecting members for semiconductor devices and the like, in conventional techniques such as wire bonding that involve the direct connection of a wiring substrate, it has become difficult to make the wire diameter any smaller than it currently is.

This situation has drawn attention in recent years to anisotropically conductive members of a type in which an array of electrically conductive elements pass completely through a film of insulating material, or of a type in which metal balls are arranged in a film of insulating material.

Inspection connectors for semiconductor devices and the like are used to avoid the large monetary losses that are incurred when, upon carrying out functional inspections after an electronic component such as a semiconductor device has been mounted on a circuit board, the electronic component is found to be defective and the circuit board is discarded together with the electronic component.

That is, by bringing electronic components such as semiconductor devices into electrical contact with a circuit board through an anisotropically conductive member at positions similar to those to be used during mounting and carrying out functional inspections, it is possible to perform the functional inspections without actually mounting the electronic components on the circuit board itself, thus enabling the above problem to be avoided.

Such an anisotropically conductive member is described in JP 2000-012619 A, which discloses "an anisotropically conductive film comprising a film substrate composed of an adhesive insulating material and a plurality of conductive paths composed of an electrically conductive material which are arrayed within the film substrate in a mutually insulated state and pass entirely through the film substrate in a thickness direction thereof, wherein the conductive paths have shapes, in a cross-section parallel to a lengthwise direction of the film substrate, with circumferences having thereon an average maximum length between two points of from 10 to 30 µm, and wherein neighboring conductive paths have intervals therebetween which are from 0.5 to 3 times said average maximum length."

JP 2005-085634 A discloses "an anisotropically conductive film comprising a film base material composed of an insulating resin and a plurality of conductive paths which are mutually insulated, pass entirely through the film base in a thickness direction thereof and are positioned in staggered rows, wherein conductive paths in mutually neighboring conductive path rows have a smaller distance therebetween than conductive paths within a single row of conductive paths."

JP 2000-012619 A and JP 2005-085634 A disclose methods of manufacturing such anisotropically conductive films in which fine wires of an anisotropically conductive material are inserted into an insulating film, the elements are integrally united by the application of heat and pressure, and scribing is subsequently carried out in the thickness direction.

JP 2002-134570 A examines a method of manufacturing an anisotropically conductive film which involves electroforming conductive columns using a resist and a mask, then pouring an insulating material in the columns and solidifying the insulating material.

JP 03-182081 A discloses "a method of manufacturing an electrically connecting member having a retaining body made of an electrically insulating material and a plurality of conductive elements provided in a mutually insulating state within the retaining body, wherein an end of each conductive element is exposed on a side of the retaining body and the other end of each conductive element is exposed on the other side of the retaining body, which method comprises:

a first step of exposing a matrix having a base and an insulating layer which, when deposited on the base, forms the retaining body to a high energy beam from the insulating layer side, thereby removing all of the insulating layer and part of the base in a plurality of regions so as to form a plurality of holes in the matrix;

a second step of filling the plurality of formed holes with a conductive material for forming said conductive elements so as to be flush with the sides of the insulating layer or to protrude from said sides; and a third step of removing said base."

JP 03-182081 A also carries out investigations on various materials (e.g., polyimide resins, epoxy resins and silicone resins) as the insulating layer.

However, with the increasing trend in recent years toward higher integration, electrode (terminal) sizes in electronic components such as semiconductor devices are becoming smaller, the number of electrodes (terminals) is increasing, and the distance between terminals is becoming tighter. Moreover, there have also appeared electronic components having a surface construction wherein the surface on each of the numerous terminals arranged at a tight pitch lies at a position that is more recessed than the surface of the component itself.

In order to be able to adapt to such electronic components, there has arisen a need to make the outer diameter (thickness) of the conductive paths in anisotropically conductive members smaller and to arrange the conductive paths in a tighter pitch.

However, in the methods of manufacturing the anisotropically conductive films and electrically connecting members described in the above references, it has been very difficult to reduce the size of the conductive paths.

SUMMARY OF THE INVENTION

It is therefore an object of the invention to provide an anisotropically conductive member which contains conductive paths having a dramatically increased density and, even today when still higher levels of integration have been achieved, can be used as electrically connecting members, inspection connectors and the like for electronic components such as semiconductor devices. Another object of the invention is to provide a method of manufacturing such anisotropically conductive members.

The inventors have made intensive studies to achieve the above objects and discovered that by using an anodized aluminum layer as an insulating base material and increasing the regularity of micropores present within the layer, the density of conductive paths can be dramatically increased, and the invention has been completed.

Accordingly, the invention provides the following (1) to (7).

(1) An anisotropically conductive member comprising:
an insulating base material; and
conductive paths composed of a conductive material which pass in a mutually insulated state through the insulating base material in a thickness direction thereof and which are provided in such a way that a first end of each conductive path is exposed on a first side of the insulating base material and a second end of each conductive path is exposed on a second side of the insulating base material;
wherein the conductive paths have a density of at least 2 million paths/mm$^2$ and the insulating base material is a structure composed of an anodized aluminum film having micropores therein.

(2) The anisotropically conductive member of (1) above, wherein the micropores have a degree of ordering, as defined by formula (i):

$$\text{Degree of ordering}(\%) = B/A \times 100 \quad (i)$$

(wherein A represents a total number of micropores in a region of measurement and B represents a number of specific micropores in the region of measurement for which, when a circle is drawn so as to be centered on a center of gravity of a specific micropore and so as to be of a smallest radius that is internally tangent to an edge of another micropore, the circle includes centers of gravity of six micropores other than the specific micropore) of at least 50%.

(3) The anisotropically conductive member of (1) or (2) above, wherein the conductive paths are provided in such a way that the first end of each conductive path protrudes from the first side of the insulating base material and the second end of each conductive path protrudes from the second side of the insulating base material.

(4) The anisotropically conductive member of any of (1) to (3) above, wherein the insulating base material has a thickness of from 1 to 1,000 μm and the conductive paths have a diameter of from 5 to 500 nm.

(5) A method of manufacturing the anisotropically conductive member of any of (1) to (4) above, comprising, in order:
an anodizing step of anodizing an aluminum substrate so as to form said anodized film having micropores therein;
a perforating step of passing holes determined by the micropores through the anodized film so as to obtain said insulating base material; and
a metal filling step of filling a metal as the conductive material into the holes which pass through the insulating base material so as to obtain said anisotropically conductive member.

(6) The method of (5) above, further comprising, after the metal filling step, a surface planarizing step of planarizing a front side and a back side of the anisotropically conductive member by chemical mechanical polishing.

(7) The method of (5) or (6), further comprising, after the metal filling step, a step of trimming the insulating base material on the surface of the anisotropically conductive member.

As shown below, the invention provides an anisotropically conductive member which contains conductive paths having a dramatically increased density and, even today when still higher levels of integration have been achieved, can be used as electrically connecting members, inspection connectors and the like for electronic components such as semiconductor devices. The invention also provides a method of manufacturing such anisotropically conductive members.

Because the anisotropically conductive member of the invention has a large number of conductive paths coupled to electrode pads on the electronic components, thus dispersing the pressure, damage to the electrodes can be reduced. Moreover, because numerous conductive paths are coupled to (contacted with) a single electrode pad, even if malfunctions occur on some of the conductive paths, the influence on testing of the overall conductivity is minimal. Also, the loads involved in positioning the circuit board under test can be greatly reduced.

In addition, the inventive method of manufacturing anisotropically conductive members is highly beneficial because it enables the anisotropically conductive members of the invention to be efficiently manufactured.

BRIEF DESCRIPTION OF THE DIAGRAMS

Figure 1B:
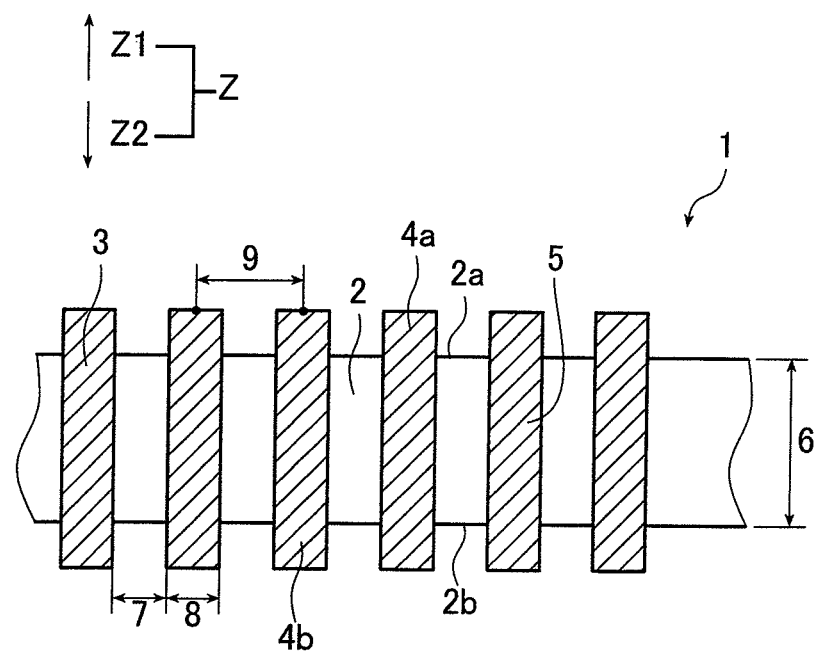
Figure 2A:
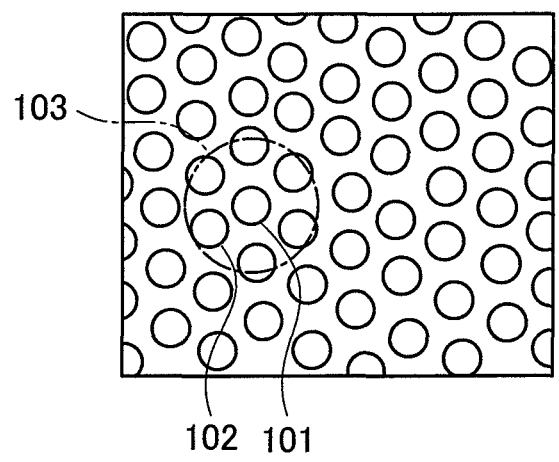
Figure 2B:
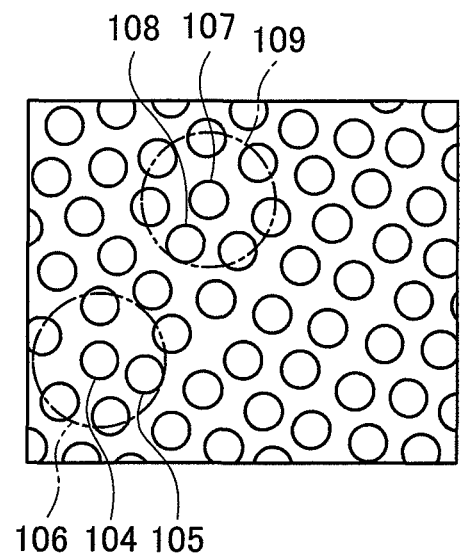
Figure 8:
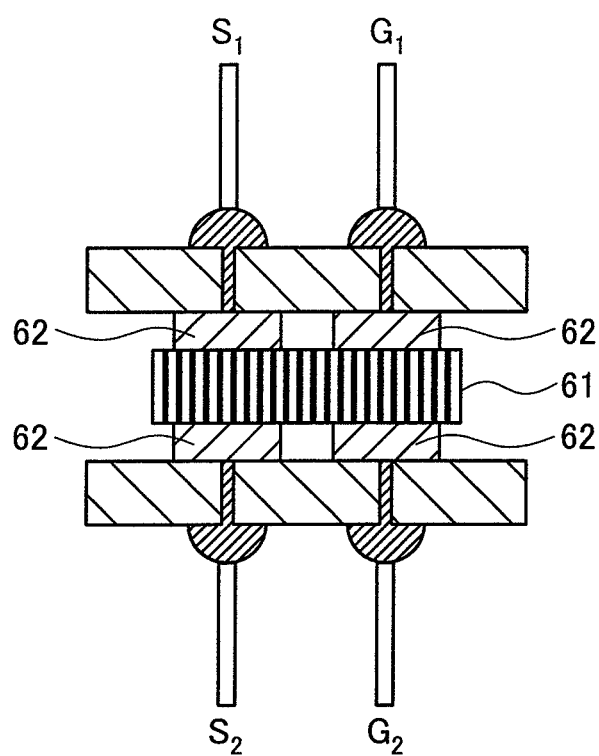
Figure 9:
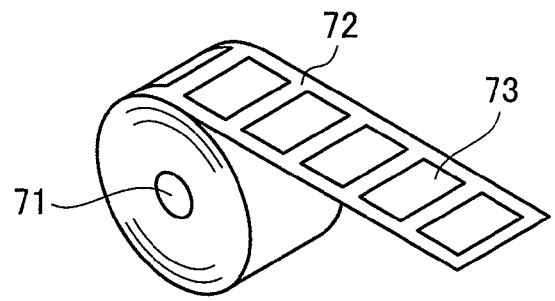
Figure 10:
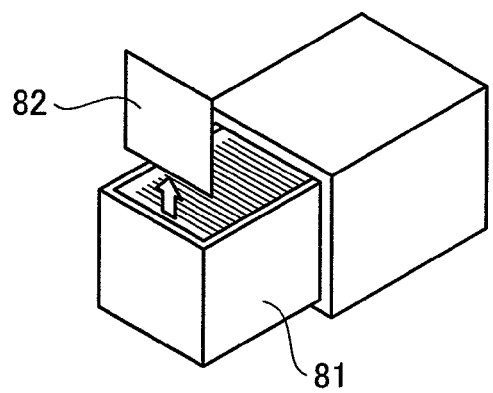
Figure 11:
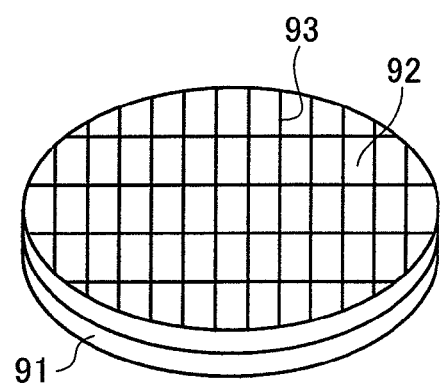

In the accompanying drawings:
FIGS. 1A and 1B are schematic diagrams illustrating a preferred embodiment of the anisotropically conductive member of the invention;
FIGS. 2A and 2B are diagrams illustrating a method for computing the degree of ordering of pores;
FIGS. 3A to 3D are schematic cross-sectional views illustrating an example of the anodizing step in the inventive method of manufacture;
FIGS. 4A to 4D are schematic cross-sectional views illustrating an example of the metal filling step in the inventive method of manufacture;
FIGS. 5A to 5G are schematic cross-sectional views illustrating the sequence of operations in the method of manufacturing anisotropically conductive members described in Comparative Example 2;
FIG. 6 is an explanatory diagram for calculating the density of conductive paths in a conductive member (film);
FIGS. 7A to 7D illustrate ways in which a semiconductor device under test and a circuit board under test are connected in the examples of the invention;
FIG. 8 is a schematic diagram of a device for measuring the insulating properties (electrical resistance) in the planar direction of the anisotropically conductive members (films) obtained in Examples 1 to 6 of the invention and Comparative Examples 1 and 2;
FIG. 9 is a schematic view illustrating one way of feeding the anisotropically conductive member of the invention;
FIG. 10 is a schematic view illustrating another way of feeding the anisotropically conductive member of the invention; and
FIG. 11 is a schematic view illustrating yet another way of feeding the anisotropically conductive member of the invention.

DETAILED DESCRIPTION OF THE INVENTION

The anisotropically conductive member of the present invention and the method of manufacture thereof are described more fully below.

The anisotropically conductive member of the invention is an anisotropically conductive member having an insulating base material and also having a plurality of conductive paths composed of a conductive material which pass in a mutually insulated state through the insulating base material in a thickness direction thereof and which are provided in such a way that a first end of each conductive path is exposed on a first side of the insulating base material and a second end of each conductive path is exposed on a second side of the insulating base material. The conductive paths have a density of at least 2 million paths/mm$^2$, and the insulating base material is a structure composed of a film obtained by anodizing an aluminum substrate.

Next, the anisotropically conductive member of the invention is described in conjunction with FIGS. 1A and 1B.

FIG. 1A is a top view schematically showing a preferred embodiment of the anisotropically conductive member of the invention, and FIG. 1B is a cross-sectional view taken along the line IB-IB in FIG. 1A.

The anisotropically conductive member 1 of the invention has an insulating base material 2 and a plurality of conductive paths 3 composed of a conductive material.

The conductive paths 3 have a length in an axial direction thereof which is equal to or greater than the size (thickness) of the insulating base material 2 in the thickness direction Z (Z1 or Z2) thereof, and are provided so as to pass through the insulating base material 2 in a mutually insulated state at a density of at least 2 million paths/mm$^2$.

Moreover, the conductive paths 3 are provided in such a way that a first end of each conductive path 3 is exposed on a first side of the insulating base material 2, and a second end of each conductive path 3 is exposed on a second side of the insulating base material 2. As shown in FIG. 1B, it is preferable for a first end of each conductive path 3 to protrude from a first side 2a of the insulating base material 2 and a second end of each conductive path 3 to protrude from a second side 2b of the insulating base material 2. That is, it is preferable for both ends of each conductive path 3 to have respective protruding portions 4a and 4b which protrude from the principal surfaces 2a and 2b of the insulating base material.

Moreover, it is preferable for the conductive paths 3 to be provided so that at least the portion thereof within the insulating base material 2 (also referred to below as "the conductive element 5 within the base material") is substantially parallel (in FIG. 1B, parallel) to the thickness direction Z (Z1 or Z2) of the insulating base material 2. More specifically, the ratio of the centerline length of the conductive path to the thickness of the insulating base material (length/thickness) is preferably from 1.0 to 1.2, and more preferably from 1.0 to 1.05.

The materials, dimensions, method of formation and other details concerning the insulating base material and the conductive paths are described below.

[Insulating Base Material]

The insulating base material in the anisotropically conductive member of the invention is a structure composed of an anodized aluminum layer having micropores therein.

In the invention, to more reliably ensure the insulating properties of conductive regions in the planar direction, it is advantageous for the micropores to have a degree of ordering, as defined by formula (i):

Degree of ordering(%)=$B/A$×100     (i)

(wherein A represents the total number of micropores in a measurement region, and B represents the number of specific micropores in the measurement region for which, when a circle is drawn so as to be centered on the center of gravity of a specific micropore and so as to be of the smallest radius that is internally tangent to the edge of another micropore, the circle includes the centers of gravity of six micropores other than the specific micropore) of preferably at least 50%, more preferably at least 70%, and even more preferably at least 80%.

FIGS. 2A and 2B are diagrams illustrating the method for computing the degree of ordering of the pores. Above formula (i) is explained more fully below in conjunction with FIGS. 2A and 2B.

In the case of a first micropore 101 shown in FIG. 2A, when a circle 103 is drawn so as to be centered on the center of gravity of the first micropore 101 and so as to be of the smallest radius that is internally tangent to the edge of another micropore (inscribed in a second micropore 102), the interior of the circle 103 includes the centers of gravity of six micropores other than the first micropore 101. Therefore, the first micropore 101 is included in B.

In the case of another first micropore 104 shown in FIG. 2B, when a circle 106 is drawn so as to be centered on the center of gravity of the first micropore 104 and so as to be of the smallest radius that is internally tangent to the edge of another micropore (inscribed in a second micropore 105), the interior of the circle 106 includes the centers of gravity of five micropores other than the first micropore 104. Therefore, the first micropore 104 is not included in B.

In the case of yet another first micropore 107 shown in FIG. 2B, when a circle 109 is drawn so as to be centered on the center of gravity of the first micropore 107 and so as to be of the smallest radius that is internally tangent to the edge of another micropore (inscribed in a second micropore 108), the interior of the circle 109 includes the centers of gravity of seven micropores other than the first micropore 107. As a result, here too, the first micropore 107 is not included in B.

From the standpoint of giving the subsequently described conductive paths a "straight pipe" structure, it is desirable that the micropores not have a branched structure; i.e., the ratio X/Y of the number of micropores X per unit surface area at one surface of the anodized film to the number of micropores Y per unit surface area at the other surface thereof is preferably from 0.90 to 1.10, more preferably from 0.95 to 1.05, and even more preferably from 0.98 to 1.02.

As with the insulating base materials (e.g., thermoplastic elastomer) used in conventional anisotropically conductive members such as films, the alumina making up the anodized aluminum film has an electrical resistivity of about $10^{14}$ Ω·cm.

In the present invention, the thickness of the insulating base material (i.e., the portion represented in FIG. 1B by the reference symbol 6) is preferably from 1 to 1,000 μm, and more preferably from 30 to 300 μm. At an insulating base material thickness within this range, the insulating base material has a good handleability.

Moreover, in the present invention, the width between the conductive paths in the insulating base material (i.e., the portion represented in FIG. 1B by the reference symbol 7) is preferably at least 10 nm, and more preferably from 20 to 200 nm. At a width between the conductive paths in the insulating base material within the foregoing range, the insulating base material functions fully as an insulating barrier.

In the invention, the insulating base material may be manufactured by, for example, anodizing an aluminum substrate so as to form an anodized film having micropores therein, then passing holes determined by the micropores entirely through (perforating) the anodized film.

The anodizing and perforating treatment steps will be explained in detail in connection with the subsequently described inventive method of manufacturing anisotropically conductive members.

[Conductive Paths]

The conductive paths in the anisotropically conductive member of the invention are composed of a conductive material.

The conductive material is not subject to any particular limitation, provided it is a material having an electrical resistivity not higher than $10^3$ Ω·cm. Illustrative examples include gold (Au), silver (Ag), copper (Cu), aluminum (Al), magnesium (Mg), nickel (Ni), and indium-doped tin oxide (ITO).

Of these, from the standpoint of electrical conductivity, copper, gold, aluminum and nickel are preferred. Copper and golf are more preferred.

From the standpoint of cost, it is more preferable for only the surfaces at the ends of the conductive paths on both sides of the insulating base material where the conductive paths are exposed or protrude to be formed of gold.

In the present invention, the conductive paths are columnar and have a diameter (in FIG. 1B, the portion represented by the reference symbol 8) of preferably from 5 to 500 nm, more preferably from 20 to 400 nm, even more preferably from 40 to 200 nm, and most preferably from 50 to 100 nm. At a conductive path diameter in the foregoing range, when electrical signals are passed over the paths, sufficient responses can be obtained, thus enabling more preferable use of the anisotropically conductive member of the invention as an electrically connecting member or inspection connector for electronic components.

Moreover, as noted above, the ratio of the centerline length of the conductive paths to the thickness of the insulating base material (length/thickness) is preferably from 1.0 to 1.2, and more preferably from 1.0 to 1.05. At a ratio of the conductive path centerline length to the insulating base material thickness in the foregoing range, the conductive paths can be regarded as having a "straight pipe" structure, enabling one-to-one responses to be reliably obtained when electrical signals have been passed over the paths, and thus making the anisotropically conductive members of the invention more preferable for use as inspection connectors and electrically connecting members for electronic components.

In the present invention, when both ends of the conductive paths protrude from both sides of the insulating base material, the protruding portions (in FIG. 1B, the portions represented by the reference symbols 4a and 4b; also referred to below as "bumps") have a height of preferably from 10 to 100 nm, and more preferably from 10 to 50 nm. At a bump height in this range, connectivity with the electrode pads on an electronic component improves.

In the present invention, the conductive paths are present in such a way as to be mutually insulated by the insulating base material, and have a density of at least 2 million paths/mm$^2$, preferably at least 10 million paths/mm$^2$, more preferably at least 50 million paths/mm$^2$, and even more preferably at least 100 million paths/mm$^2$.

By having a conductive path density in the foregoing range, the anisotropically conductive member of the invention can be used as, for example, inspection connectors and electrically connecting members for electronic components such as semiconductor devices, even at the high level to which integration has advanced today.

In the present invention, the center-to-center distance between neighboring conductive paths (in FIG. 1B, the portions represented by the reference symbol 9; also referred to below as the "pitch") is preferably from 20 to 500 nm, more preferably from 40 to 200 nm, and even more preferably from 50 to 140 nm. At a pitch in the foregoing range, a balance between the conductive path diameter and the width between conductive paths (insulating barrier thickness) is easily achieved.

In the present invention, the conductive paths may be created by, for example, filling with metal the interiors of the holes determined by micropores that have been made to pass entirely through the insulating base material.

The treatment step in which the holes are filled with metal is explained in detail in the subsequently described inventive method of manufacturing anisotropically conductive members.

As described above, in the anisotropically conductive member of the invention, the insulating base material has a thickness of from 1 to 1,000 μm, and preferably from 30 to 300 μm, and the conductive paths have a diameter of from 5 to 500 nm, and preferably from 20 to 400 nm. These dimensions are desirable because high insulating properties are retained while at the same time enabling electrical conductivity to be tested at a high density.

The inventive method of manufacturing anisotropically conductive members (sometimes referred to below simply as "the inventive method of manufacture") is a method of manufacturing the above-described anisotropically conductive member of the invention, and includes at least the steps of, in order:

anodizing an aluminum substrate so as to form an anodized film having micropores therein;

passing holes determined by the micropores entirely through the anodized film so as to obtain an insulating base material; and filling a metal as the conductive material into the holes which pass through the insulating base material so as to obtain an anisotropically conductive member.

The aluminum substrate used in the inventive method of manufacture and each of the treatment steps carried out on the aluminum substrate are described below in detail.

[Aluminum Substrate]

The aluminum substrate that may be used in the inventive method of manufacture is not subject to any particular limitation. Illustrative examples include pure aluminum plate; alloy plates composed primarily of aluminum and containing trace amounts of other elements; substrates made of low-purity aluminum (e.g., recycled material) on which high-purity aluminum has been vapor-deposited; substrates such as silicon wafers, quartz or glass whose surface has been covered with high-purity aluminum by a process such as vapor deposition or sputtering; and resin substrates on which aluminum has been laminated.

Of the aluminum substrate of the invention, the surface on which an anodized film is provided by anodizing treatment to be described below has an aluminum purity of preferably at least 99.5 wt %, more preferably at least 99.9 wt % and even more preferably at least 99.99 wt %. At an aluminum purity within the above range, the micropore arrangement will be sufficiently well-ordered.

In the practice of the invention, the surface of the aluminum substrate on which the subsequently described anodizing treatment step is to be carried out is preferably subjected beforehand to degreasing treatment and mirror-like finishing treatment.

<Heat Treatment>

Heat treatment is preferably carried out at a temperature of from 200 to 350° C. for a period of about 30 seconds to about 2 minutes. The orderliness of the array of micropores formed in the subsequently described anodizing treatment step is enhanced in this way.

Following heat treatment, it is preferable to rapidly cool the aluminum substrate. The method of cooling is exemplified by a method involving direct immersion of the aluminum substrate in water or the like.

<Degreasing Treatment>

Degreasing treatment is carried out with a suitable substance such as an acid, alkali or organic solvent so as to dissolve and remove organic substances, including dust, grease and resins, adhering to the aluminum substrate surface, and thereby prevent defects due to organic substances from arising in each of the subsequent treatments.

Preferred degreasing methods include the following: a method in which an organic solvent such as an alcohol (e.g., methanol), ketone (e.g., methyl ethyl ketone), petroleum benzin or volatile oil is contacted with the surface of the aluminum substrate at ambient temperature (organic solvent method); a method in which a liquid containing a surfactant such as soap or a neutral detergent is contacted with the surface of the aluminum substrate at a temperature of from ambient temperature to 80° C., after which the surface is rinsed with water (surfactant method); a method in which an aqueous sulfuric acid solution having a concentration of 10 to 200 g/L is contacted with the surface of the aluminum substrate at a temperature of from ambient temperature to 70° C. for a period of 30 to 80 seconds, following which the surface is rinsed with water; a method in which an aqueous solution of sodium hydroxide having a concentration of 5 to 20 g/L is contacted with the surface of the aluminum substrate at ambient temperature for about 30 seconds while electrolysis is carried out by passing a direct current through the aluminum substrate surface as the cathode at a current density of 1 to 10 $A/dm^2$, following which the surface is contacted with an aqueous solution of nitric acid having a concentration of 100 to 500 g/L and thereby neutralized; a method in which the surface of the aluminum substrate is contacted with any of various known anodizing electrolytic solutions at ambient temperature while electrolysis is carried out by passing a direct current at a current density of 1 to 10 $A/dm^2$ or an alternating current through the aluminum substrate surface as the cathode; a method in which an alkaline aqueous solution having a concentration of 10 to 200 g/L is contacted with the surface of the aluminum substrate at 40 to 50° C. for 15 to 60 seconds, following which the surface is contacted with an aqueous solution of nitric acid having a concentration of 100 to 500 g/L and thereby neutralized; a method in which an emulsion prepared by mixing a surfactant, water and the like into an oil such as gas oil or kerosene is contacted with the surface of the aluminum substrate at a temperature of from ambient temperature to 50° C., following which the surface is rinsed with water (emulsion degreasing method); and a method in which a mixed solution of, for example, sodium carbonate, phosphates and surfactant is contacted with the surface of an aluminum substrate at a temperature of ambient temperature to 50° C. for 30 to 180 seconds, following which the surface is rinsed with water (phosphate method).

Of these, the organic solvent method, surfactant method, emulsion degreasing method and phosphate method are preferred from the standpoint of removing grease from the aluminum surface while causing substantially no aluminum dissolution.

Known degreasers may be used in degreasing treatment. For example, degreasing treatment may be carried out using any of various commercially available degreasers by the prescribed method.

<Mirror-Like Finishing Treatment>

Mirror-like finishing treatment is carried out to eliminate surface asperities of the aluminum substrate and improve the uniformity and reproducibility of grain-forming treatment by a process such as electrodeposition. Examples of surface asperities of the aluminum substrate include rolling streaks formed during rolling when the aluminum substrate has been produced by a process including rolling.

In the practice of the invention, mirror-like finishing treatment is not subject to any particular limitation, and may be carried out using any suitable method known in the art. Examples of suitable methods include mechanical polishing, chemical polishing, and electrolytic polishing.

Illustrative examples of suitable mechanical polishing methods include polishing with various commercial abrasive cloths, and methods that combine the use of various commercial abrasives (e.g., diamond, alumina) with buffing. More specifically, a method which is carried out with an abrasive while changing over time the abrasive used from one having coarser particles to one having finer particles is appropriately illustrated. In such a case, the final abrasive used is preferably one having a grit size of 1500. In this way, a glossiness of at least 50% (in the case of rolled aluminum, at least 50% in both the rolling direction and the transverse direction) can be achieved.

Examples of chemical polishing methods include various methods mentioned in the $6^{th}$ edition of Aluminum Handbook (Japan Aluminum Association, 2001), pp. 164-165.

Preferred examples include phosphoric acid/nitric acid method, Alupol I method, Alupol V method, Alcoa R5 method, $H_3PO_4$—$CH_3COOH$—Cu method and $H_3PO_4$—$HNO_3$—$CH_3COOH$ method. Of these, the phosphoric acid/nitric acid method, the $H_3PO_4$—$CH_3COOH$—Cu method and the $H_3PO_4$—$HNO_3$—$CH_3COOH$ method are especially preferred.

With chemical polishing, a glossiness of at least 70% (in the case of rolled aluminum, at least 70% in both the rolling direction and the transverse direction) can be achieved.

Examples of electrolytic polishing methods include various methods mentioned in the $6^{th}$ edition of Aluminum Handbook (Japan Aluminum Association, 2001), pp. 164-165; the method described in U.S. Pat. No. 2,708,655; and the method described in Jitsumu Hyomen Gijutsu (Practice of Surface Technology), Vol. 33, No. 3, pp. 32-38 (1986).

With electrolytic polishing, a glossiness of at least 70% (in the case of rolled aluminum, at least 70% in both the rolling direction and the transverse direction) can be achieved.

These methods may be suitably combined and used. In an illustrative method that may be preferably used, mechanical polishing which is carried out by changing the abrasive over time from one having coarser particles to one having finer particles is followed by electrolytic polishing.

Mirror-like finishing treatment enables a surface having, for example, a mean surface roughness $R_a$ of 0.1 μm or less and a glossiness of at least 50% to be obtained. The mean surface roughness $R_a$ is preferably 0.03 μm or less, and more preferably 0.02 μm or less. The glossiness is preferably at least 70%, and more preferably at least 80%.

The glossiness is the specular reflectance which can be determined in accordance with JIS Z8741-1997 (Method 3: 60° Specular Gloss) in a direction perpendicular to the rolling direction. Specifically, measurement is carried out using a variable-angle glossmeter (e.g., VG-1D, manufactured by Nippon Denshoku Industries Co., Ltd.) at an angle of incidence/reflection of 60° when the specular reflectance is 70% or less, and at an angle of incidence/reflection of 20° when the specular reflectance is more than 70%.

[Anodizing Treatment Step]

In the anodizing step, the above-described aluminum substrate is subjected to anodizing treatment, thereby forming a micropore-containing anodized film on the surface of the aluminum substrate.

Anodizing treatment in the inventive method of manufacture can be carried out using a method known in the art. However, because it is desirable for the insulating base material to be an anodized aluminum film having micropores arranged therein so that the degree of ordering as defined by above formula (i) is at least 50%, the use of the subsequently described self-ordering method or a constant voltage treatment is preferred.

The self-ordering method is a method which enhances the orderliness by using the regularly arranging nature of micropores in the anodized film and eliminating factors that may disturb an orderly arrangement. Specifically, an anodized film is formed on high-purity aluminum at a voltage appropriate for the type of electrolytic solution and at a low speed over an extended period of time (e.g., from several hours to well over ten hours).

In this method, because the micropore diameter is dependent on the voltage, to some degree it is possible to obtain the desired micropore diameter by controlling the voltage.

To form micropores by the self-ordering method, at least the subsequently described anodizing treatment (A) should be carried out. However, micropore formation is preferably carried out by a process (Self-Ordering Process I) in which the subsequently described anodizing treatment (A), film removal treatment (B) and re-anodizing treatment (C) are carried out in this order, or a process (Self-Ordering Process II) in which the subsequently described anodizing treatment (D) and anodized film dissolution treatment (E) are carried out in this order at least once.

The individual treatment steps in Self-Ordering Processes I and II serving as preferred embodiments herein are described below in detail.

[Self-Ordering Process I]

<Anodizing Treatment (A)>

The average flow velocity of electrolytic solution in anodizing treatment (A) is preferably from 0.5 to 20.0 m/min, more preferably from 1.0 to 15.0 m/min, and even more preferably from 2.0 to 10.0 m/min. By carrying out anodizing treatment (A) at the foregoing flow velocity, a uniform and high degree of ordering can be achieved.

The method for causing the electrolytic solution to flow under the above conditions is not subject to any particular limitation. For example, a method involving the use of a common agitator such as a stirrer may be employed. The use of a stirrer in which the stirring speed can be controlled with a digital display is particularly desirable because it enables the average flow velocity to be regulated. An example of such a stirrer is the Magnetic Stirrer HS-50D (manufactured by As One Corporation).

Anodizing treatment (A) may be carried out by, for example, a method in which current is passed through the aluminum substrate as the anode in a solution having an acid concentration of from 1 to 10 wt %.

The solution used in anodizing treatment (A) is preferably an acid solution. A solution of hydrochloric acid, sulfuric acid, phosphoric acid, chromic acid, oxalic acid, sulfamic acid, benzenesulfonic acid, amidosulfonic acid, glycolic acid, tartaric acid, malic acid or citric acid is more preferred. Of these, a solution of sulfuric acid, phosphoric acid or oxalic acid is especially preferred. These acids may be used singly or as combinations of two or more thereof.

The anodizing treatment (A) conditions vary depending on the electrolytic solution employed, and thus cannot be strictly specified. However, the following conditions are generally preferred: an electrolytic solution concentration of from 0.1 to 20 wt %, a solution temperature of from −10 to +30° C., a current density of from 0.01 to 20 A/dm$^2$, a voltage of from 3 to 500 V, and an electrolysis time of from 0.5 to 30 hours. An electrolytic solution concentration of from 0.5 to 15 wt %, a solution temperature of from −5 to +25° C., a current density of from 0.05 to 15 A/dm$^2$, a voltage of from 5 to 250 V, and an electrolysis time of from 1 to 25 hours are more preferred. An electrolytic solution concentration of from 1 to 10 wt %, a solution temperature of from 0 to 20° C., a current density of from 0.1 to 10 A/dm$^2$, a voltage of from 10 to 200 V, and an electrolysis time of from 2 to 20 hours are even more preferred.

The treatment time in anodizing treatment (A) is preferably from 0.5 minute to 16 hours, more preferably from 1 minute to 12 hours, and even more preferably from 2 minutes to 8 hours.

Aside from being carried out at a constant voltage, anodizing treatment (A) may be carried out using a method in which the voltage is intermittently or continuously varied. In such cases, it is preferable to have the voltage gradually decrease. It is possible in this way to lower the resistance of the anodized film, bringing about the formation of small micropores in the anodized film. As a result, this approach is preferable for improving uniformity, particularly when sealing is subsequently carried out by electrodeposition treatment.

In the present invention, the anodized film formed by such anodizing treatment (A) has a thickness of preferably from 1 to 1,000 μm, more preferably from 5 to 500 μm, and even more preferably from 10 to 300 μm.

In the present invention, the micropores in the anodized film formed by such anodizing treatment (A) have an average pore density of preferably from 50 to 1,500 pores/μm$^2$.

Also, it is preferable for the micropores to have a surface coverage of from 20 to 50%, the surface coverage of the micropores being defined here as the ratio of the total surface area of the micropore openings to the surface area of the aluminum surface.

<Film Removal Treatment (B)>

In film removal treatment (B), the anodized film formed on the surface of the aluminum substrate by the above-described anodizing treatment (A) is dissolved and removed.

The subsequently described perforating treatment step may be carried out immediately after forming an anodized film on the surface of the aluminum substrate by the above-described anodizing treatment (A). However, after the anodizing treatment (A), it is preferable to additionally carry out film removal treatment (B) and the subsequently described re-anodizing treatment (C) in this order, followed by the perforating treatment step.

Given that the orderliness of the anodized film increases as the aluminum substrate is approached, by using this film removal treatment (B) to remove the anodized film that has been formed in (A), the lower portion of the anodized film remaining on the aluminum substrate emerges at the surface, affording an orderly array of pits. Therefore, in film removal treatment (B), aluminum is not dissolved; only the anodized film composed of alumina (aluminum oxide) is dissolved.

The alumina dissolving solution is preferably an aqueous solution containing at least one substance selected from the group consisting of chromium compounds, nitric acid, phosphoric acid, zirconium compounds, titanium compounds, lithium salts, cerium salts, magnesium salts, sodium hexafluorosilicate, zinc fluoride, manganese compounds, molybdenum compounds, magnesium compounds, barium compounds, and uncombined halogens.

Illustrative examples of chromium compounds include chromium (III) oxide and chromic (VI) oxide.

Examples of zirconium compounds include zirconium ammonium fluoride, zirconium fluoride and zirconium chloride.

Examples of titanium compounds include titanium oxide and titanium sulfate.

Examples of lithium salts include lithium fluoride and lithium chloride.

Examples of cerium salts include cerium fluoride and cerium chloride.

Examples of magnesium salts include magnesium sulfate.

Examples of manganese compounds include sodium permanganate and calcium permanganate.

Examples of molybdenum compounds include sodium molybdate.

Examples of magnesium compounds include magnesium fluoride pentahydrate.

Examples of barium compounds include barium oxide, barium acetate, barium carbonate, barium chlorate, barium chloride, barium fluoride, barium iodide, barium lactate, barium oxalate, barium perchlorate, barium selenate, barium selenite, barium stearate, barium sulfite, barium titanate, barium hydroxide, barium nitrate, and hydrates thereof.

Of the above barium compounds, barium oxide, barium acetate and barium carbonate are preferred. Barium oxide is especially preferred.

Examples of uncombined halogens include chlorine, fluorine and bromine.

Of the above, the alumina dissolving solution is preferably an acid-containing aqueous solution. Examples of the acid include sulfuric acid, phosphoric acid, nitric acid and hydrochloric acid. A mixture of two or more acids is also acceptable.

The acid concentration is preferably at least 0.01 mol/L, more preferably at least 0.05 mol/L, and even more preferably at least 0.1 mol/L. Although there is no particular upper limit in the acid concentration, in general, the concentration is preferably 10 mol/L or less, and more preferably 5 mol/L or less. A needlessly high concentration is uneconomical, in addition to which higher concentrations may result in dissolution of the aluminum substrate.

The alumina dissolving solution has a temperature of preferably −10° C. or higher, more preferably −5° C. or higher, and even more preferably 0° C. or higher. Carrying out treatment using a boiling alumina dissolving solution destroys or disrupts the starting points for self-ordering. Hence, the alumina dissolving solution is used without being boiled.

An alumina dissolving solution dissolves alumina, but does not dissolve aluminum. Here, the alumina dissolving solution may dissolve a very small amount of aluminum, so long as it does not dissolve a substantial amount of aluminum.

Film removal treatment (B) is carried out by bringing an aluminum substrate on which an anodized film has been formed into contact with the above-described alumina dissolving solution. Examples of the contacting method include, but are not limited to, dipping and spraying. Of these, dipping is preferred.

Dipping is a treatment in which the aluminum substrate on which an anodized film has been formed is immersed in the alumina dissolving solution. To achieve uniform treatment, it is desirable to carry out stirring at the time of dipping treatment.

The dipping treatment time is preferably at least 10 minutes, more preferably at least 1 hour, even more preferably at least 3 hours, and most preferably at least 5 hours.

<Re-Anodizing Treatment (C)>

After the anodized film is removed by the above-described film removal treatment (B) and well-ordered pits are formed on the surface of the aluminum substrate, by carrying out anodizing treatment once again, an anodized film having micropores with an even higher degree of ordering can be formed.

Anodizing treatment in the re-anodizing treatment (C) step may be carried out using a method known in the art, although it is preferably carried out under the same conditions as the above-described anodizing treatment (A).

Alternatively, suitable use may be made of a method in which the current is repeatedly turned on and off while keeping the dc voltage constant, or a method in which the current is repeatedly turned on and off while intermittently varying the dc voltage. Because these methods result in the formation of small micropores in the anodized film, they are preferable for improving uniformity, particularly when sealing is to be carried out by electrodeposition treatment.

When the re-anodizing treatment (C) is carried out at a low temperature, the array of micropores is well-ordered and the pore diameter is uniform.

On the other hand, by carrying out the re-anodizing treatment (C) at a relatively high temperature, the micropore array may be disrupted or the variance in pore diameter may be set within a given range. The variance in pore diameter may also be controlled by means of the treatment time.

In the practice of the invention, the anodized film formed by such re-anodizing treatment (C) has a thickness of preferably from 30 to 1,000 μm, and more preferably from 50 to 500 μm.

Moreover, in the invention, the micropores formed in the anodized film by such anodizing treatment (C) have a diameter of preferably from 0.01 to 0.5 μm, and more preferably from 0.02 to 0.1 μm.

The average pore density is preferably at least 10 million pores/mm$^2$.

In Self-Ordering Process I, in place of the above-described anodizing treatment (A) and film removal treatment (B), use may be made of, for example, a physical method, a particle beam method, a block copolymer method or a resist patterning/exposure/etching process to form pits as starting points for micropore formation by the above-described re-anodizing treatment (C).

<Physical Method>

Physical methods are exemplified by methods which use imprinting (transfer methods and press patterning methods in which a plate or roll having projections thereon is pressed against the aluminum substrate to form depressions on the plate). A specific example is a method in which a plate having numerous projections on a surface thereof is pressed against the aluminum surface, thereby forming depressions. For example, the method described in JP 10-121292 A may be used.

Another example is a method in which polystyrene spheres are densely arranged on the aluminum surface, SiO$_2$ is vapor-deposited onto the spheres, then the polystyrene spheres are removed and the substrate is etched using the vapor-deposited SiO$_2$ as the mask, thereby forming depressions.

<Particle Beam Method>

In a particle beam method, depressions are formed by irradiating the aluminum surface with a particle beam. This method has the advantage that the positions of the depressions can be freely controlled.

Examples of the particle beam include a charged particle beam, a focused ion beam (FIB), and an electron beam.

An example of a particle beam method that may be used is the method described in JP 2001-105400 A.

<Block Copolymer Method>

The block copolymer method involves forming a block copolymer layer on the aluminum surface, forming an islands-in-the-sea structure in the block copolymer layer by thermal annealing, then removing the island components to form depressions.

An example of a block copolymer method that may be used is the method described in JP 2003-129288 A.

<Resist Patterning/Exposure/Etching Process>

In a resist patterning/exposure/etching process, resist on the surface of an aluminum plate is exposed and developed by photolithography or electron-beam lithography to form a resist pattern. The resist is then etched, forming depressions which pass entirely through the resist to the aluminum surface.

[Self-Ordering Process II]

<Step 1: Anodizing Treatment (D)>

An electrolytic solution known in the art may be used in anodizing treatment (D). However, the orderliness of the array of pores can be greatly improved by carrying out treatment using an electrolytic solution which satisfies the following condition for the parameter R, defined by general formula (ii) below, under dc constant-voltage conditions: $160 \leq R \leq 200$, preferably $170 \leq R \leq 190$, and more preferably $175 \leq R \leq 185$.

$$R = A \text{ [nm/s]} \div (B \text{ [nm/s]} \times \text{applied voltage } [V]) \quad \text{(ii)}$$

In the formula, A is the rate of anodized film formation when current is applied, and B is the rate of anodized film dissolution when current is not applied.

The average flow velocity of electrolytic solution in anodizing treatment (D) is the same as for the above-described anodizing treatment (A); that is, preferably from 0.5 to 20.0 m/min, more preferably from 1.0 to 15.0 m/min, and even more preferably from 2.0 to 10.0 m/min. By carrying out anodizing treatment (D) at the foregoing flow velocity, a uniform and high orderliness can be achieved.

Moreover, as in the above-described anodizing treatment (A), the method for causing the electrolytic solution to flow under the foregoing conditions, while not subject to any particular limitation, is exemplified by a method involving the use of a common agitator such as a stirrer. The use of a stirrer in which the stirring speed can be controlled with a digital display is particularly desirable because it enables the average flow velocity to be regulated. An example of such a stirrer is the Magnetic Stirrer HS-50D (manufactured by As One Corporation).

The viscosity of the anodizing treatment solution at 25° C. and 1 atmosphere is preferably from 0.0001 to 100.0 Pa·s, and more preferably from 0.0005 to 80.0 Pa·s. By carrying out anodizing treatment (D) with an electrolytic solution having a viscosity in the foregoing range, a uniform and high orderliness can be achieved.

The electrolytic solution used in anodizing treatment (D) may be either an acidic solution or an alkaline solution, although the use of an acidic electrolytic solution is preferable for increasing the circularity of the pores.

As in above-described anodizing treatment (A), a solution of hydrochloric acid, sulfuric acid, phosphoric acid, chromic acid, oxalic acid, glycolic acid, tartaric acid, malic acid, citric acid, sulfamic acid, benzenesulfonic acid or amidosulfonic acid is more preferred. Of these, a solution of sulfuric acid, phosphoric acid or oxalic acid is especially preferred. These acids may be used singly or as combinations of two or more thereof, and may be used after adjustment to the desired parameter R calculated based on above general formula (ii).

The anodizing treatment (D) conditions vary depending on the electrolytic solution employed, and thus cannot be strictly specified. However, the following conditions are generally preferred as in the above-described anodizing treatment (A): an electrolytic solution concentration of from 0.1 to 20 wt %, a solution temperature of from −10 to +30° C., a current density of from 0.01 to 20 A/dm$^2$, a voltage of from 3 to 500 V, and an electrolysis time of from 0.5 to 30 hours. An electrolytic solution concentration of from 0.5 to 15 wt %, a solution temperature of from −5 to +25° C., a current density of from 0.05 to 15 A/dm$^2$, a voltage of from 5 to 250 V, and an electrolysis time of from 1 to 25 hours are more preferred. An electrolytic solution concentration of from 1 to 10 wt %, a solution temperature of from 0 to 20° C., a current density of from 0.1 to 10 A/dm$^2$, a voltage of from 10 to 200 V, and an electrolysis time of from 2 to 20 hours are even more preferred.

In the present invention, the anodized film formed by such anodizing treatment (D) has a thickness of preferably from 0.1 to 300 μm, more preferably from 0.5 to 150 μm, and even more preferably from 1 to 100 μm.

In this invention, the micropores in the anodized film formed by such anodizing treatment (D) have an average pore density of preferably from 50 to 1,500 pores/μm$^2$.

Also, it is preferable for the micropores to have a surface coverage of from 20 to 50%, the surface coverage of the micropores being defined here as the ratio of the total surface area of the micropore openings to the surface area of the aluminum surface.

Figure 3A:
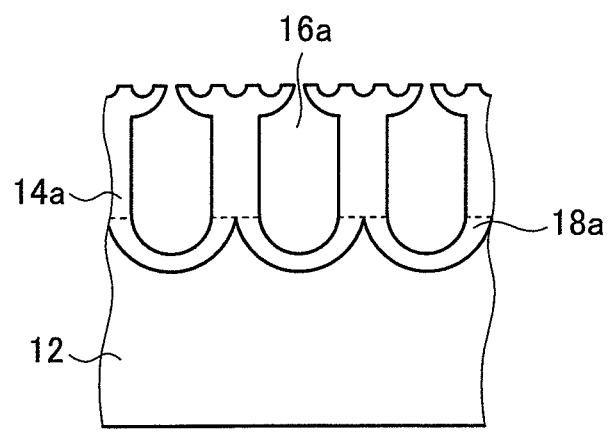

This anodizing treatment (D) forms, as shown in FIG. 3A, an anodized film 14a having micropores 16a on the surface of an aluminum substrate 12. A barrier layer 18a exists on the aluminum substrate 12 side of the anodized film 14a.

<Step 2: Anodized film Dissolution Treatment (E)>

The anodized film dissolution treatment (E) is a pore widening treatment in which the diameter of the pores present in the anodized film formed by the above anodizing treatment (D) is enlarged.

Anodized film dissolution treatment (E) is carried out by bringing the aluminum substrate that has been subjected to the above anodizing treatment (D) into contact with an acidic aqueous solution or an alkaline aqueous solution. Examples of the contacting method include, but are not limited to, dipping and spraying. Of these, dipping is preferred.

In cases where an acidic aqueous solution is used in anodized film dissolution treatment (E), it is preferable to use an aqueous solution of an inorganic acid such as sulfuric acid, phosphoric acid, nitric acid or hydrochloric acid, or a mixture thereof. Of these, aqueous solutions which do not contain chromic acid are preferred on account of their excellent safety. The acidic aqueous solution has a concentration of preferably from 1 to 10 wt %. The acidic aqueous solution has a temperature of preferably from 25 to 60° C.

On the other hand, in cases where an alkaline aqueous solution is used in anodized film dissolution treatment (E), it is preferable to use an aqueous solution of at least one alkali selected from the group consisting of sodium hydroxide, potassium hydroxide and lithium hydroxide. The alkaline aqueous solution has a concentration of preferably from 0.1 to 5 wt % and a temperature of preferably from 20 to 35° C.

More specifically, preferred use may be made of, for example, aqueous solutions of phosphoric acid having a concentration of 50 g/L and a temperature of 40° C., aqueous solutions of sodium hydroxide having a concentration of 0.5 g/L and a temperature of 30° C., and aqueous solutions of potassium hydroxide having a concentration of 0.5 g/L and a temperature of 30° C.

The length of immersion in the acid aqueous solution or alkaline aqueous solution is preferably from 8 to 120 minutes, more preferably from 10 to 90 minutes, and even more preferably from 15 to 60 minutes.

In anodized film dissolution treatment (E), the amount of pore enlargement varies with the anodizing treatment (D) conditions, although the ratio of pore enlargement after treatment relative to before treatment is preferably from 1.05 to 100, more preferably from 1.1 to 75, and even more preferably from 1.2 to 50.

Figure 3B:
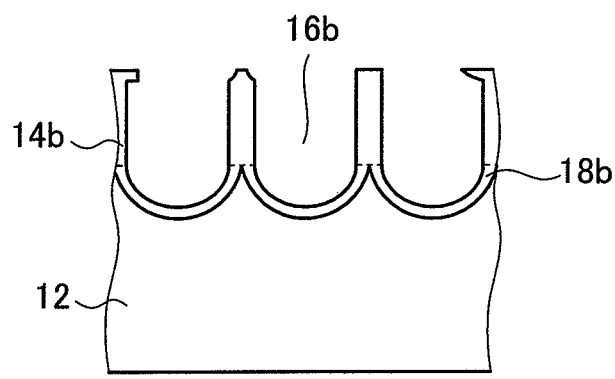

By means of this anodized film dissolution treatment (E), as shown in FIG. 3B, the surface of the anodized film 14a and the interiors of the micropores 16a (barrier layer 18a and porous layer) shown in FIG. 3A dissolve, giving an aluminum member composed of an aluminum substrate 12 having thereon an anodized film 14b containing micropores 16b. As in FIG. 3A, a barrier layer 18b is present on the aluminum substrate 12 side of the anodized film 14b.

<Step 3: Anodizing Treatment (D)>

In Self-Ordering Process II, after the above-described anodized film dissolution treatment (E), it is desirable to again carry out anodizing treatment (D).

Figure 3C:
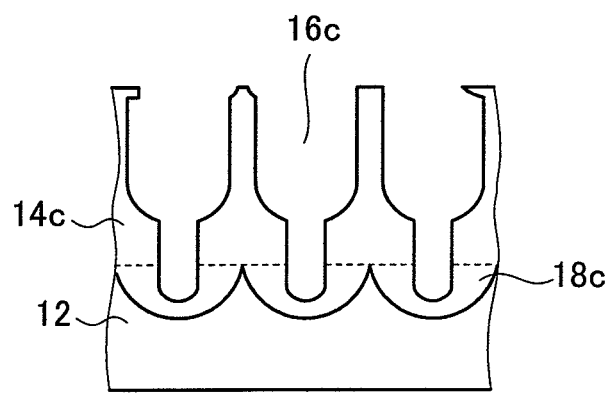

By carrying out anodizing treatment (D) once again, as shown in FIG. 3C, the oxidation reactions on the aluminum substrate 12 shown in FIG. 3B proceed further, giving an aluminum member composed of the aluminum substrate 12 having thereon an anodized film 14c containing micropores 16c which have become even deeper than the micropores 16b shown in FIG. 3B. Here too, as in FIG. 3A, a barrier layer 18c is present on the aluminum substrate 12 side of the anodized film 14c.

<Step 4: Anodized film Dissolution Treatment (E)>

In Self-Ordering Process II, after the above-described anodizing treatment (D), anodized film dissolution treatment (E) and anodizing treatment (D) have been carried out in this order, it is desirable to again carry out anodized film dissolution treatment (E).

In this step, the treatment solution enters the micropores and completely dissolves the anodized film that was formed in the anodizing treatment (D) carried out as Step 3, thereby enlarging the diameter of the micropores formed in the anodizing treatment (D) carried out as Step 3.

Figure 3D:
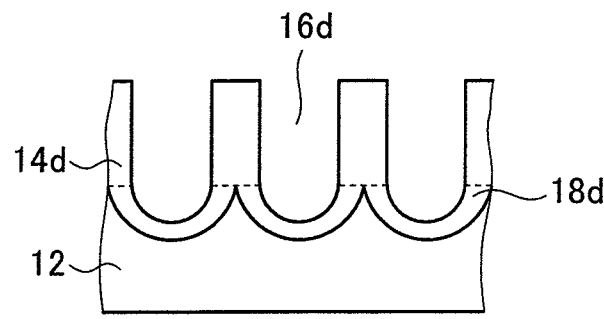

That is, as shown in FIG. 3D, the anodized film dissolution treatment (E) carried out as Step 4 dissolves the interiors of the micropores 16c on the surface side from the point of inflection of the anodized film 14c shown in FIG. 3C, thereby giving an aluminum member composed of the aluminum substrate 12 having thereon an anodized film 14d containing "straight pipe" micropores 16d. Here too, as in FIG. 3A, a barrier layer 18d is present on the aluminum substrate 12 side of the anodized film 14d.

The amount of enlargement in the diameter of the micropores varies with the conditions of the anodizing treatment (D) carried out as Step 3, although the ratio of pore enlargement after treatment relative to before treatment is preferably from 1.05 to 100, more preferably from 1.1 to 75, and even more preferably from 1.2 to 50.

Self-Ordering Process II carries out one or more cycles of the above-described anodizing treatment (D) and anodized film dissolution treatment (E). The greater the number of times these treatments are repeated, the higher the degree of orderliness achieved in the above-described pore array.

Moreover, when the anodized film formed in the immediately preceding anodizing treatment (D) is completely dissolved in the anodized film dissolution treatment (E), the circularity of the micropores as seen from the surface of the anodized film improves dramatically. Hence, the above cycle is repeated preferably two or more times, more preferably three or more times, and even more preferably four or more times.

When the above cycle is repeated two or more times, the conditions of the anodized film dissolution treatment and the anodizing treatment in each of the respective cycles may be the same or different. Moreover, anodizing treatment may be carried out as the final treatment step.

[Constant-Voltage Treatment]

Constant-voltage treatment is a method of treatment that forms an anodized film at a low speed, taking a long time to do so (e.g., from several hours to well over ten hours). In this treatment method, because the pore diameter is dependent on the voltage, it is essential that the voltage be controlled to a constant level so as to prevent branching of the micropores.

The average flow velocity of the electrolytic solution in anodizing treatment is preferably from 0.5 to 20 m/min, more preferably from 1.0 to 15.0 m/min, and even more preferably from 2.0 to 10.0 m/min. By carrying out anodizing treatment at the foregoing flow velocity, a uniform and high degree of ordering can be achieved.

The method for causing the electrolytic solution to flow under the foregoing conditions is not subject to any particular limitation. For example, a method involving the use of a common agitator such as a stirrer may be employed. The use of a stirrer in which the stirring speed can be controlled with a digital display is particularly desirable because it enables the average flow velocity to be regulated. An example of such a stirrer is the Magnetic Stirrer HS-50D (manufactured by As One Corporation).

Anodizing treatment may be carried out by, for example, a method in which current is passed through the aluminum substrate as the anode in a solution having an acid concentration of from 1 to 10 wt %.

The solution used in the anodizing treatment is preferably an acid solution. A solution of sulfuric acid, phosphoric acid, chromic acid, oxalic acid, sulfamic acid, benzenesulfonic acid, amidosulfonic acid, glycolic acid, tartaric acid, malic acid or citric acid is more preferred. Of these, a solution of sulfuric acid, phosphoric acid or oxalic acid is especially preferred. These acids may be used singly or as combinations of two or more thereof.

The anodizing treatment conditions vary depending on the electrolytic solution employed, and thus cannot be strictly specified. However, the following conditions are generally preferred: an electrolytic solution concentration of from 0.1 to 20 wt %, a solution temperature of from −10 to +30° C., a current density of from 0.01 to 20 A/dm$^2$, a voltage of from 3 to 300 V, and an electrolysis time of from 0.5 to 50 hours. An electrolytic solution concentration of from 0.5 to 15 wt %, a solution temperature of from −5 to +25° C., a current density of from 0.05 to 15 A/dm$^2$, a voltage of from 5 to 250 V, and an electrolysis time of from 1 to 25 hours are more preferred. An electrolytic solution concentration of from 1 to 10 wt %, a solution temperature of from 0 to 20° C., a current density of from 0.1 to 10 A/dm$^2$, a voltage of from 10 to 200 V, and an electrolysis time of from 2 to 20 hours are even more preferred.

The treatment time in the anodizing treatment is preferably from 0.5 minute to 16 hours, more preferably from 1 minute to 12 hours, and even more preferably from 2 minutes to 8 hours.

In the present invention, the anodized film formed by such anodizing treatment has a thickness of preferably from 1 to 1,000 μm, more preferably from 5 to 500 μm, and even more preferably from 10 to 300 μm.

In the invention, the micropores in the anodized film formed by such anodizing treatment have an average pore density of preferably from 50 to 1,500 pores/μm$^2$.

Also, it is preferable for the micropores to have a surface coverage of from 20 to 50%, the surface coverage of the micropores being defined here as the ratio of the total surface area of the micropore openings to the surface area of the aluminum surface.

[Perforating Treatment Step]

The perforating treatment step mentioned above is a step in which, following the anodizing treatment step described above, holes determined by the micropores formed by the above-described anodization are made to pass entirely through the anodized film, thereby obtaining the above-described insulating base material.

Illustrative examples of the perforating treatment step include a method in which, following the above-mentioned anodizing treatment step, the aluminum substrate (the portion represented in FIG. 3D by the reference symbol 12) is dissolved, then the bottom of the anodized film (the portion represented in FIG. 3D by the reference symbol 18d) is removed; and a method in which, following the above-mentioned anodizing treatment step, the aluminum substrate and the anodized film near the aluminum substrate are physically cut away.

The first of these methods, which is a preferred embodiment of the invention, is described in detail below.

<Dissolution of Aluminum Substrate>

A treatment solution which does not readily dissolve the anodized film (alumina) but readily dissolves aluminum is used for dissolution of the aluminum substrate following the anodizing treatment step.

That is, use is made of a treatment solution which has an aluminum dissolution rate of at least 1 μm/min, preferably at least 3 μm/min, and more preferably at least 5 μm/min, and has an anodized film dissolution rate of 0.1 nm/min or less, preferably 0.05 nm/min or less, and more preferably 0.01 nm/min or less.

Specifically, dipping treatment is carried out using a treatment solution which includes at least one metal compound having a lower ionization tendency than aluminum, and which has a pH of 4 or less or 8 or more, preferably 3 or less or 9 or more, and more preferably 2 or less or 10 or more.

Preferred examples of such treatment solutions include solutions which are composed of, as the base, an aqueous solution of an acid or an alkali and which have blended therein a compound of, for example, manganese, zinc, chromium, iron, cadmium, cobalt, nickel, tin, lead, antimony, bismuth, copper, mercury, silver, palladium, platinum or gold (e.g., hexachloroplatinic acid), or a fluoride or chloride of any of these metals.

Of the above, it is preferable for the treatment solution to be based on an aqueous solution of an acid and to have blended therein a chloride compound.

Treatment solutions of an aqueous solution of hydrochloric acid in which mercury chloride has been blended (hydrochloric acid/mercury chloride), and treatment solutions of an aqueous solution of hydrochloric acid in which copper chloride has been blended (hydrochloric acid/copper chloride) are especially preferred from the standpoint of the treatment latitude.

However, the composition of the treatment solution is not subject to any particular limitation. For example, use may be made of a bromine/methanol mixture, a bromine/ethanol mixture, or aqua regia.

The acid or alkali concentration of such a treatment solution is preferably from 0.01 to 10 mol/L, and more preferably from 0.05 to 5 mol/L.

The treatment temperature used in such treatment solutions is preferably from −10 to +80° C., and more preferably from 0 to 60° C.

In the present invention, dissolution of the aluminum substrate is carried out by bringing the aluminum substrate following the anodizing treatment step into contact with the above-described treatment solution. Examples of contacting methods include, but are not limited to, immersion and spraying. Of these, immersion is preferred. The period of contact at this time is preferably from 10 seconds to 5 hours, and more preferably from 1 minute to 3 hours.

<Removing Bottom of Anodized Film>

Removal of the bottom of the anodized film following dissolution of the aluminum substrate is carried out by immersion in an aqueous solution of an acid or an alkali. By removing the anodized film at the bottom, holes determined by the micropores pass entirely through the anodized film.

Removal of the bottom of the anodized film is preferably carried out by a method in which first the anodized film is immersed in a pH buffer solution so as to fill the interiors of the holes with the pH buffer solution from the open side of the holes determined by micropores, following which the opposite side of the anodized film from that having micropore openings therein, i.e., the bottom of the anodized film, is brought into contact with an aqueous solution of an acid or an alkali.

When an aqueous solution of an acid is used, it is preferable to use an aqueous solution of an inorganic acid such as sulfuric acid, phosphoric acid, nitric acid or hydrochloric acid, or a mixture thereof. The concentration of the aqueous acid solution is preferably from 1 to 10 wt %. The temperature of the aqueous acid solution is preferably from 25 to 40° C.

On the other hand, when an aqueous solution of an alkali is used, it is preferable to use an aqueous solution of at least one alkali selected from the group consisting of sodium hydroxide, potassium hydroxide and lithium hydroxide. The concentration of the aqueous alkali solution is preferably from 0.1 to 5 wt %. The temperature of the aqueous alkali solution is preferably from 20 to 35° C.

Specifically, it is preferable to use, for example, an aqueous solution of phosphoric acid having a concentration of 50 g/L and a temperature of 40° C., an aqueous solution of sodium hydroxide having a concentration of 0.5 g/L and a temperature of 30° C., or an aqueous solution of potassium hydroxide having a concentration of 0.5 g/L and a temperature of 30° C.

The period of immersion in the aqueous acid solution or aqueous alkali solution is preferably from 8 to 120 minutes, more preferably from 10 to 90 minutes, and even more preferably from 15 to 60 minutes.

In cases where the anodized film is immersed beforehand in a pH buffer solution, a buffer solution suitably adapted to the above-mentioned acid or alkali is used.

Figure 4A:
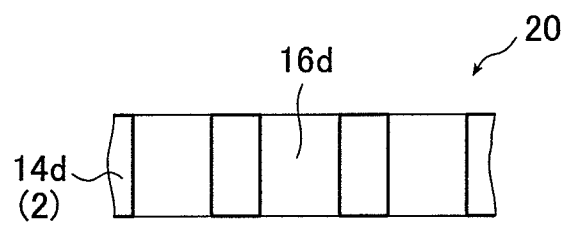

This perforating treatment step yields a structure in which the aluminum substrate 12 and the barrier layer 18d shown in FIG. 3D have been removed. That is, an insulating base material 20 shown in FIG. 4A is obtained.

On the other hand, if the aluminum substrate and the anodized film near the aluminum substrate are removed by cutting these portions away, an example of a method that may be suitably used for this purpose involves physically removing the aluminum substrate (the portion represented in FIG. 3D by the reference symbol 12) and the bottom of the anodized film (the portion represented in FIG. 3D by the reference symbol 18d) by cutting with a laser or the like or by some type of abrasive treatment.

Metal Filling Step

The metal filling step is a step in which, following the above-described perforating treatment step, the interiors of the holes that pass entirely through the resulting insulating base material are filled with metal as a conductive material, thereby giving an anisotropically conductive member.

Here, the metal which is filled into the holes is the material making up the conductive paths in the anisotropically conductive member, and is the same metal as that described above in connection with the anisotropically conductive member of the invention.

In the inventive method of manufacture, an electrolytic plating method or an electroless plating method may be used as the metal filling method.

Here, in conventionally known electrolytic plating methods that are used for coloring or other purposes, it is difficult to selectively deposit (grow) metal inside holes having a high aspect ratio. The reason is thought to be that the deposited metal is consumed within the holes so that the plating does not grow even when electrolysis is carried out for at least a fixed period of time.

Therefore, in the inventive method of manufacture, when metal filling is carried out by an electrolytic plating method, it is necessary to provide rest periods during pulse electrolysis or constant potential electrolysis. The rest periods must be at least 10 seconds, and are preferably from 30 to 60 seconds.

To promote stirring of the electrolytic solution, it is desirable to apply ultrasound energy.

Moreover, the electrolysis voltage is generally not more than 20 V, and preferably not more than 10 V, although it is preferable to first measure the deposition potential of the target metal in the electrolytic solution to be used and carry out constant potential electrolysis at that potential+not more than 1V. When carrying out constant potential electrolysis, it is desirable to use also cyclic voltammetry. To this end, use may be made of potentiostats such as those available from Solartron, BAS, Hokuto Denko and Ivium.

Plating may be carried out using a plating solution known in the art.

More specifically, when copper is to be deposited, an aqueous solution of copper sulfate may generally be used. The concentration of copper sulfate is preferably from 1 to 300 g/L, and more preferably from 100 to 200 g/L. Deposition can be promoted by adding hydrochloric acid to the electrolytic solution. In such a case, the concentration of hydrochloric acid is preferably from 10 to 20 g/L.

When gold is to be deposited, it is desirable to carry out plating by alternating current electrolysis using a sulfuric acid solution of a tetrachloroaurate.

Because it takes a long time by electroless plating to completely fill metal into the high-aspect holes obtained from micropores, in the inventive method of manufacture, it is desirable to use an electroplating method to fill the holes with metal.

Figure 4B:
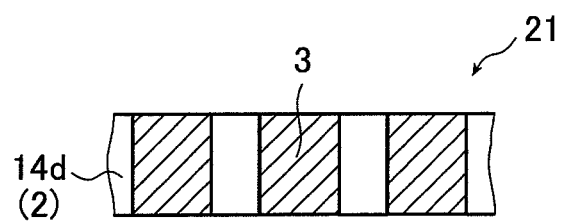

This metal filling step yields an anisotropically conductive member 21 shown in FIG. 4B.

[Surface Planarization]

Following the above metal filling step, it is preferable to include in the inventive method of manufacture a surface planarizing step in which the front side and the back side of the anisotropically conductive member are planarized by chemical mechanical polishing.

By carrying out chemical mechanical polishing (CMP), the front and back sides of the insulating base material after the holes have been filled with metal (i.e., the anisotropically conductive member) are planarized, enabling excess metal adhering to the surfaces to be removed.

CMP treatment may be carried out using a CMP slurry such as PNANERLITE-7000 (available from Fujimi Inc.), GPX HSC800 produced by Hitachi Chemical Co., Ltd., or CL-1000 produced by AGC Seimi Chemical Co., Ltd.

Because it is not desirable to polish the anodized film, a slurry for interlayer dielectrics or barrier metals should not be used.

[Trimming]

In the inventive method of manufacture, when the above metal filling step or the above CMP treatment has been carried out, it is preferable to provide a trimming step following the surface planarization step.

Trimming is a step in which, when the above metal filling step or CMP treatment has been carried out, a portion of only the insulating base material on the surface of the anisotropically conductive member is removed following the surface planarization step, thereby causing the conductive paths to protrude.

Trimming may be carried out under the same conditions as the above-described anodized film dissolution treatment (E), provided these are conditions where the metal making up the conductive paths does not dissolve. The use of phosphoric acid, which lends itself readily to control of the dissolution speed, is especially preferred.

Figure 4C:
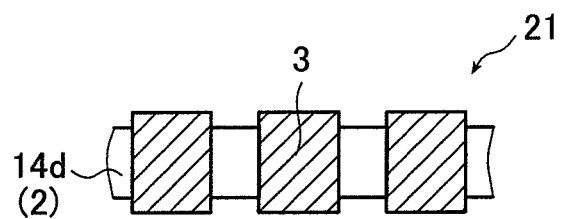

This trimming step enables an anisotropically conductive member 21 shown in FIG. 4C to be obtained.

[Electrodeposition]

Figure 4D:
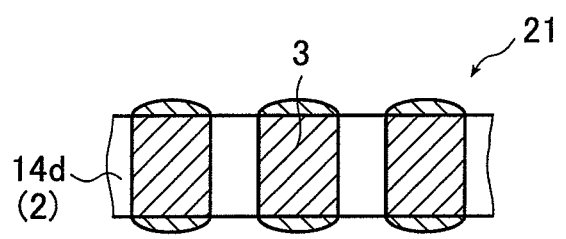

In the inventive method of manufacture, it is possible to provide also, in place of or subsequent to the above-described trimming step, an electrodeposition step in which the same or a different conductive metal is deposited only on the surfaces of the conductive paths 3 shown in FIG. 4B (see FIG. 4D).

As used herein, "electrodeposition" refers to treatment which includes also electroless plating that utilizes differences in the electronegativities of dissimilar metals.

Here, electroless plating is a step that involves immersion in an electroless plating solution (e.g., a solution obtained by suitably mixing a reducing agent-containing treatment solution with a pH of 6 to 13 into a precious metal-containing treatment solution having a pH of 1 to 9).

In the inventive method of manufacture, the above-described trimming and electrodeposition steps are preferably carried out shortly before the anisotropically conductive member is used. Carrying out these treatment steps shortly before use has the advantage that the conductive path metal making up the bump portions will not oxidize up to shortly before use.

[Protective Film Formation]

In the inventive method of manufacture, because the insulating base material formed of alumina undergoes hydration from moisture in the air, resulting in a change in the pore diameter over time, it is preferable to carry out protective film-forming treatment prior to the above-described metal filling step.

Illustrative examples of protective films include inorganic protective films containing elemental zirconium and/or elemental silicon, and organic protective films containing a water-insoluble polymer.

The method of forming an elemental zirconium-containing protective film is not subject to any particular limitation, although a commonly used method of treatment involves direct immersion in an aqueous solution in which a zirconium compound is dissolved. From the standpoint of the strength and stability of the protective film, the use of an aqueous solution in which a phosphorus compound has also been dissolved is preferred.

Illustrative examples of the zirconium compound include zirconium, zirconium fluoride, sodium hexafluorozirconate, calcium hexafluorozirconate, zirconium chloride, zirconium oxychloride, zirconium oxynitrate, zirconium sulfate, zirconium ethoxide, zirconium propoxide, zirconium butoxide, zirconium acetylacetonate, tetrachlorobis(tetrahydrofuran) zirconium, bis(methylcyclopentadienyl)zirconium dichloride, dicyclopentadienylzirconium dichloride and ethylenebis(indenyl)zirconium (IV) dichloride. Of these, sodium hexafluorozirconate is preferred.

From the standpoint of the uniformity of the protective film thickness, the concentration of zirconium compound in the aqueous solution is preferably from 0.01 to 10 wt %, and more preferably from 0.05 to 5 wt %.

Illustrative examples of the phosphorus compound include phosphoric acid, sodium phosphate, calcium phosphate, dibasic sodium phosphate and dibasic calcium phosphate. Of these, dibasic sodium phosphate is preferred.

From the standpoint of the uniformity of the protective film thickness, the concentration of the phosphorus compound in the aqueous solution is preferably from 0.1 to 20 wt %, and more preferably from 0.5 to 10 wt %.

The treatment temperature is preferably from 0 to 120° C., and more preferably from 20 to 100° C.

The method of forming a protective film containing elemental silicon is not subject to any particular limitation, although a commonly used method of treatment involves direct immersion in an aqueous solution in which an alkali metal silicate is dissolved.

The thickness of the protective film can be adjusted by varying the ratio between the silicate ingredients silicon dioxide $SiO_2$ and alkali metal oxide $M_2O$ (generally represented as the molar ratio $[SiO_2]/[M_2O]$) and the concentrations thereof in the aqueous solution of an alkali metal silicate.

It is especially preferable here to use sodium or potassium as M.

The molar ratio $[SiO_2]/[M_2O]$ is preferably from 0.1 to 5.0, and more preferably from 0.5 to 3.0.

The $SiO_2$ content is preferably from 0.1 to 20 wt %, and more preferably from 0.5 to 10 wt %.

The organic protective film is preferably obtained by a method which involves direct immersion in an organic solvent in which a water-insoluble polymer is dissolved, followed by heat treatment to evaporate off only the solvent.

Illustrative examples of the water-insoluble polymer include polyvinylidene chloride, poly(meth)acrylonitrile, polysulfone, polyvinyl chloride, polyethylene, polycarbonate, polystyrene, polyamide and cellophane.

Illustrative examples of the organic solvent include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone and toluene.

The concentration is preferably from 0.1 to 50 wt %, and more preferably from 1 to 30 wt %.

The heating temperature during solvent evaporation is preferably from 30 to 300° C., and more preferably from 50 to 200° C.

After protective film formation, the anodized film including the protective film has an overall thickness of preferably from 0.1 to 1,000 μm, and more preferably from 1 to 500 μm.

In the inventive method of manufacture, depending on the intended use of the anisotropically conductive member thus obtained, the hardness and heat cycle resistance can be controlled by carrying out heat treatment.

For example, heating is carried out at a temperature of preferably at least 100° C., more preferably at least 200° C., and even more preferably at least 400° C. Moreover, the heating time is preferably from 10 seconds to 24 hours, more preferably from 1 minute to 12 hours, and even more preferably from 30 minutes to 8 hours. By means of such heat treatment, the hardness increases, in addition to which expansion and contraction during heat cycles involving heating and cooling in semiconductor manufacturing operations and the like are suppressed.

EXAMPLES

Example 1

(A) Mirror-Like Finishing Treatment (Electrolytic Polishing)

A high-purity aluminum substrate (Sumitomo Light Metal Industries, Ltd.; purity, 99.99 wt %; thickness, 0.4 mm) was cut to a size of 10 cm square that allows it to be anodized, then subjected to electrolytic polishing treatment using an electrolytic polishing solution of the composition indicated below at a voltage of 25 V, a solution temperature of 65° C., and a solution flow velocity of 3.0 m/min.

A carbon electrode was used as the cathode, and a GP0110-30R unit (Takasago, Ltd.) was used as the power supply. In addition, the flow velocity of the electrolytic solution was measured using the vortex flow monitor FLM22-10PCW manufactured by As One Corporation.

Electrolytic Polishing Solution Composition:

| | |
|---|---|
| 85 wt % Phosphoric acid (Wako Pure Chemical Industries, Ltd.) | 660 mL |
| Pure water | 160 mL |
| Sulfuric acid | 150 mL |
| Ethylene glycol | 30 mL |

(B) Anodizing Treatment Step (Self-Ordering Method I)

After electrolytic polishing, the aluminum substrate was subjected to 5 hours of preliminary anodizing treatment with an electrolytic solution of 0.30 mol/L sulfuric acid under the following conditions: voltage, 25 V; solution temperature, 15° C.; solution flow velocity, 3.0 m/min.

After preliminary anodizing treatment, the aluminum substrate was then subjected to film removal treatment in which it was immersed for 12 hours in a mixed aqueous solution (solution temperature, 50° C.) of 0.2 mol/L chromic anhydride and 0.6 mol/L phosphoric acid.

Next, the aluminum substrate was subjected to one hour of re-anodizing treatment with an electrolytic solution of 0.30 mol/L sulfuric acid under the following conditions: voltage, 25 V; solution temperature, 15° C.; solution flow velocity, 3.0 m/min.

The preliminary anodizing treatment and the re-anodizing treatment were both carried out using a stainless steel electrode as the cathode and using a GP0110-30R unit (Takasago, Ltd.) as the power supply. In addition, use was made of NeoCool BD36 (Yamato Scientific Co., Ltd.) as the cooling system, and Pairstirrer PS-100 (Tokyo Rikakikai Co., Ltd.) as the stirring and warming unit. The average flow velocity of the electrolytic solution was measured using the vortex flow monitor FLM22-10PCW (As One Corporation).

(C) Perforating Treatment Step

Next, the aluminum substrate was dissolved by 3 hours of immersion at 20° C. in a 20 wt % aqueous solution of mercuric chloride (corrosive sublimate), in addition to which the bottom of the anodized film was removed by 30 minutes of immersion at 30° C. in 5 wt % phosphoric acid, thereby giving a structure (insulating base material) composed of an anodized film having micropores therein.

(D) Heat Treatment

The structure obtained as described above was then subjected to one hour of heat treatment at a temperature of 400° C.

(E) Metal Filling Treatment Step

Next, a copper electrode was placed in close contact with one surface of the structure following the above-described heat treatment, and electrolytic plating was carried out using the copper electrode as the cathode and using platinum as the anode.

Using a mixed solution of copper sulfate/sulfuric acid/hydrochloric acid=200/50/15 (g/L) held at 25° C. as the electrolytic solution, constant-voltage pulse electrolysis was carried out, thereby producing a structure (an anisotropically conductive member) in which the holes determined by the micropores were filled with copper.

An electroplating system manufactured by Yamamoto-MS Co., Ltd. and a power supply (HZ-3000) manufactured by Hokuto Denko Corp. were used to carry out constant-voltage pulse electrolysis. The deposition potential was checked by carrying out cyclic voltammetry in the plating solution, following which the film side potential was set to −2 V and electrolysis was carried out. The pulse waveform in constant-voltage pulse electrolysis was a square waveform. Specifically, electrolysis treatments lasting 60 seconds at a time were carried out a total of five times with 40-second rest periods between the respective treatments, so as to provide a total electrolysis treatment time of 300 seconds.

The surface after copper filling treatment was examined by field emission scanning electron microscopy (FE-SEM), showing some overflow of the copper from the surface of the anodized film.

(F) Surface Planarizing Treatment Step

Next, CMP treatment was carried out on the top and back sides of the copper-filled structure.

PNANERLITE-7000 (available from Fujimi Inc.) was used as the CMP slurry.

(G) Trimming Treatment

The CMP-treated structure was then immersed in a phosphoric acid solution so as to selectively dissolve the anodized film, thereby causing the copper columns serving as conductive paths to protrude from the anodized film.

The same phosphoric acid solution as in the above-described perforating treatment was used, and the treatment time was set to 5 minutes.

Next, the structure was rinsed with water and dried, then examined by FE-SEM.

As a result, as also shown in Table 1 below, the height of the protruding portions of the conductive paths (i.e., the bump height) was found to be 10 nm, the diameter of the conductive paths (i.e., the size of the electrode pads) was 40 nm, and the thickness of the member was 50 μm. In addition, the ratio of the centerline length of the conductive paths to the thickness of the member (length/thickness) was 1.01.

Example 2

Each of the treatments in steps (A) to (G) above was carried out as in Example 1, following which a treatment step was carried out in which the copper protruding from the surface of the insulating base material (anodized film) was coated with gold.

That is, the anisotropically conductive member following trimming treatment that was obtained in Example 1 was immersed for 15 minutes in a commercial electroless plating solution (PRECIOUSFAB) maintained at 50° C., thereby causing gold to be deposited on the surface of the copper protruding from the surface of the insulating base material.

The resulting anisotropically conductive member was examined by FE-SEM in the same way as in Example 1, whereupon the protruding portions were found to be rounded and the height of the bumps was found to have increased by about 20 nm. Moreover, as also shown in Table 1 below, the conductive path diameter (i.e., the size of the electrode pads) was 40 nm, and the thickness of the member was 50 μm. The ratio of the centerline length of the conductive paths to the thickness of the member (length/thickness) was 1.02.

Example 3

A structure (anisotropically conductive member) was fabricated by carrying out the preliminary anodizing and re-anodizing treatments in (B) Anodizing Treatment Step (Self-Ordering Method I) above using an electrolytic solution of 0.50 mol/L oxalic acid and at a voltage of 40 V, a solution temperature of 15° C. and a solution flow velocity of 3.0 m/min, and by carrying out the above-described (G) trimming treatment for a period of 10 minutes, aside from which treatment was carried out under the same conditions as in Example 1.

The resulting anisotropically conductive member was examined by FE-SEM in the same way as in Example 1. As also shown in Table 1 below, the bump height was 40 nm, the conductive path diameter (i.e., the size of the electrode pads) was 120 nm, and the thickness of the member was 50 μm. The ratio of the centerline length of the conductive paths to the thickness of the member (length/thickness) was 1.01.

Comparative Example 1

First, a coating layer made of an adhesive insulating material is formed on a metal wire. The thickness of the coating layer is generally from about 3 to about 50 μm, and preferably from about 5 to about 20 μm. By giving the coating layer a thickness in this range, the conductive path to conductive path spacing relative to the average value for the maximum length (width) of the conductive paths can be set to the predetermined spacing mentioned above.

This insulated wire is wound onto a core, thereby forming a roll-type wire coil.

It is preferable to wind the coil to the maximum density using a known technique for producing electromagnetic coils such as for relays and transformers, e.g., a spindle method or a flyer method. Coil specifications such as the coil width (the total length of the bobbin in an electromagnetic coil, which relates to the number of turns in one layer) and thickness (which relates to the number of layers) are suitably selected according to the intended purpose.

Heat and/or pressure is then applied to the wire coil so as to cause mutually adjoining insulated conductors within and between layers to fuse and/or pressure bond at the coating layer portions made of the adhesive insulating material and thereby unite, forming a wire coil block.

Next, the wire coil block is sliced into thin sheets, thereby forming anisotropically conductive films.

To ensure electrical conductivity, the metal material portion was exposed by reactive etching. Using an ion reactive plasma system, treatment was carried out for 30 minutes at 2,000 W of power while causing tetrafluoromethane ($CF_4$) as the reactive gas to flow at a rate of 0.5 L/min.

Because it is desirable for both ends of the conductive paths to be covered with conductive material, a metal material was laminated thereon using a plating or vapor phase decomposition process.

That is, a polycarbodiimide resin (glass transition point, 170° C.) was used as the adhesive insulating material, and a polyamideimide resin (glass transition point, 270° C.) was used as the insulating material.

Using round columnar copper wire with a maximum length (width) averaging 18 μm as the conductive paths, gold was laminated onto the surfaces at both ends of the conductive paths, setting the centerline distance (pitch) between mutually neighboring conductive paths at 35 μm and the thickness of the anisotropically conductive film at 50 μm.

Examination by FE-SEM indicated that, as also shown in Table 1 below, the height of the protruding portions of the conductive paths (bump height) was 15 μm, and the diameter of the conductive paths (the size of the electrolyte pads) was 18 μm. Moreover, the ratio of the centerline length of the conductive paths to the thickness of the anisotropically conductive film (length/thickness) was confirmed to be 1.01.

Comparative Example 2

An example corresponding to the examples described in JP 2002-134570 A was carried out as Comparative Example 2.

Figure 5A:
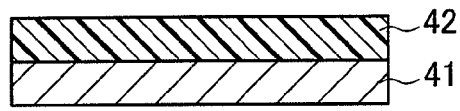
Figure 6:
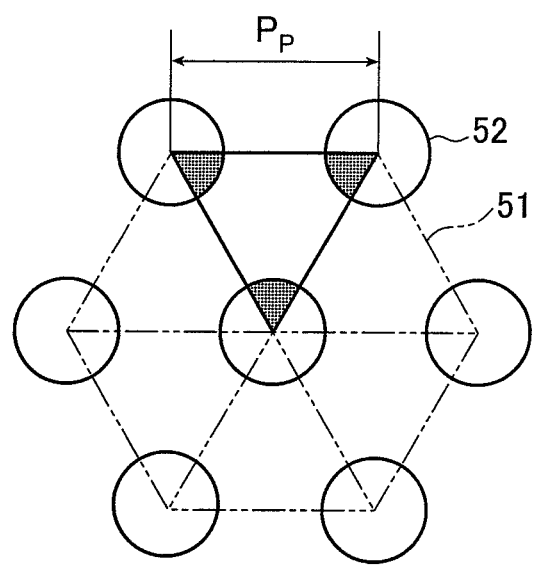

First, as shown in FIG. 5A, a resist layer (film) 42 having an average thickness of 150 μm was formed on a square copper substrate 41 having a thickness of 0.5 mm and a width and length of 30 mm each.

Polymethyl methacrylate resin (PMMA resin) was used as the resist material. Following film formation, 4 hours of drying was carried out at room temperature.

Figure 5B:
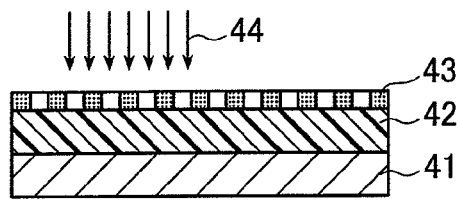

Next, as shown in FIG. 5B, a mask (manufactured by Forschungszentrum Karlsruhe GmbH of Germany) 43 on which 20 μm diameter circles were arrayed in a tightly packed arrangement at a pitch therebetween of 40 μm was placed on the copper substrate 41, following which x-rays 44 were irradiated from above in the vertical direction, thereby exposing the portions of the resist film not shielded by the mask 43 to x-rays.

Synchrotron x-rays, for which the shape precision on the resist sidewalls is excellent, were used.

Figure 5C:

Next, as shown in FIG. 5C, the x-ray exposed portions of the resist film were dissolved and removed by development, thereby forming a matrix M having a microstructure resist film 45 in which have been formed porous structures with an aspect ratio (length/diameter) of 10.

Figure 5D:
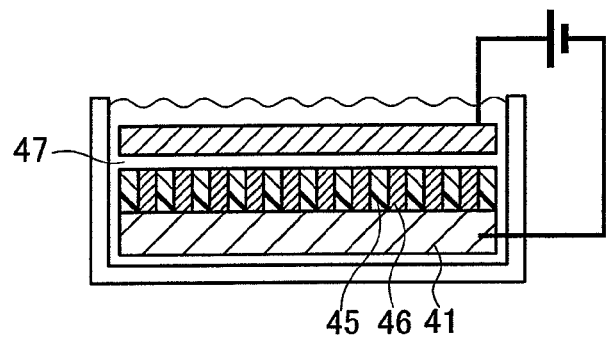

Next, as shown in FIG. 5D, a group 46 of electrically conductive fine lines made of nickel was formed by electroforming in the above dissolved and removed portions. Using a sulfamic acid bath for the plating solution 47, electroforming was carried out with a nickel electrode serving as the electrode on the positive side and a copper substrate serving as the electrode on the negative side.

Figure 5E:
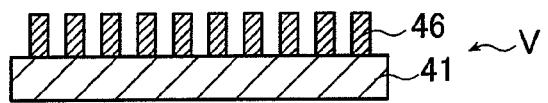

After the electroforming step, as shown in FIG. 5E, the resist film (microstructure resist film) 45 remaining around the group 46 of conductive nickel lines that have been formed was dissolved and removed, giving a base V composed of the group 46 of conductive nickel lines formed on the copper substrate 41.

Figure 5F:
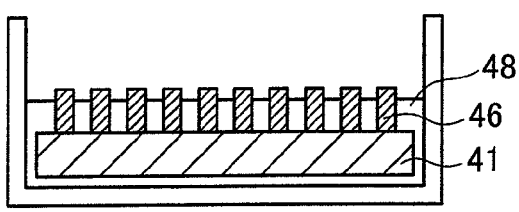

The base V was then placed in a mold. As shown in FIG. 5F, a sheet-like base material 48 (in this example, a silicone resin) was packed around the group 46 of conductive nickel lines 46, then cured, thereby fabricating a sheet-like substrate made of silicone resin on the copper substrate.

Figure 5G:
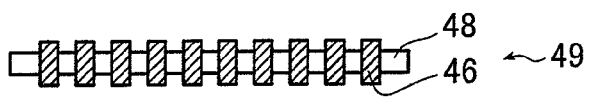

Next, the copper substrate was removed from the sheet-like silicone substrate thus fabricated, and the top and back sides were trimmed with an excimer laser, thereby giving an anisotropically conductive film 49 like that shown in FIG. 5G. In this example, the silicone resin layer had a thickness of about 100 μm, and the height of the protruding portions of the conductive elements (i.e., the bump height) averaged 10 μm. Moreover, in the resulting anisotropically conductive film 49, the protruding ends of each conductive line were sharpened by grinding, in addition to which gold plating was applied to the ends to lower the electrical resistance.

Examination by FE-SEM indicated that, as also shown in Table 1 below, the height of the protruding portions of the conductive paths (bump height) was 10 μm, and the diameter of the conductive paths (i.e., the size of the electrode pads) was 20 μm. In addition, the ratio of the centerline length of the conductive paths to the thickness of the anisotropically conductive film (length/thickness) was 1.05.

The shapes of the anisotropically conductive members (films) obtained in Examples 1 to 3 of the invention and Comparative Examples 1 and 2 are shown in Table 1 below.

In each case, the degree of ordering was obtained as follows. A surface image (magnification, 20,000×) of the resulting anisotropically conductive member (film) was taken by FE-SEM, and the degree of ordering, as defined by above formula (i), was measured in a 2 μm×2 μm field. The degree of ordering was measured in ten places, and the average of the measurements was calculated.

In the table, "period" refers to the center to center distance (pitch) between conductive paths. A surface image (magnification, 50,000×) of the anisotropically conductive member (film) was taken by FE-SEM, and measurements were taken at 50 points. The average of those measurements is given in the table as the period.

The density was determined according to the formula shown below, which assumes that, as shown in FIG. 6, one-half of a conductive path 52 lies within a unit lattice 51 of micropores arranged so that the degree of ordering, as defined by above formula (i), is 50% or more. In the following formula, Pp represents the period in micrometers (μm).

$$\text{Density[conductive paths/}\mu m^2]=(1/2)/(Pp \times Pp \times \sqrt{3} \times (1/2))$$

TABLE 1

| | Degree of ordering (%) | Period (nm) | Density (paths/mm$^2$) | Size of electrode pads | Bump height | Thickness (μm) | Length/thickness |
|---|---|---|---|---|---|---|---|
| EX 1 | 92 | 63 | approx. 150 million | 40 nm diameter | 10 nm | 50 | 1.01 |
| EX 2 | 90 | 63 | approx. 150 million | 40 nm diameter | 20 nm | 50 | 1.02 |
| EX 3 | 95 | 200 | approx. 14 million | 120 nm diameter | 40 nm | 50 | 1.01 |

TABLE 1-continued

|  | Degree of ordering (%) | Period (nm) | Density (paths/mm$^2$) | Size of electrode pads | Bump height | Thickness (μm) | Length/thickness |
|---|---|---|---|---|---|---|---|
| CE 1 | 100 | — | approx. 470 | 18 μm | 15 μm | 50 | 1.01 |
| CE 2 | 98 | — | approx. 360 | 20 μm | 10 μm | 120 | 1.05 |

Semiconductor devices under test and circuit boards under test were connected using the anisotropically conductive members (films) obtained in Examples 1 to 3 of the invention and Comparative Examples 1 and 2, and their electrical conductivities were tested.

The connection conditions between the semiconductor devices under test and the circuit boards under test are shown in Table 2 below, and the modes of connection are as shown in Measurement Examples I to IV in FIGS. 7A-7D. The Measurement Example I shown in FIG. 7A involves direct testing with probes (a probe card), without using an intervening anistropically conductive member (film). In Measurement Example IV, the probe array has been optimized by modifying the signal leads of the circuit board under test.

In addition, the conductivity was tested by inserting an anisotropically conductive member (film) between a semiconductor device under test and a circuit board under test, and applying a load of 30 kgf of pressure per chip. The results are shown in Table 3.

TABLE 2

| Semiconductor device under test | Chip size (mm square) | Number of pads | Size of pad opening (μm square) |
|---|---|---|---|
| Measurement Examples I, II | 10 | 320 | 50 |
| Measurement Examples III, IV | 10 | 1280 | 10 |

| Circuit board under test | Circuit width (μm) | Circuit thickness (μm) | Bumps for probe card |
|---|---|---|---|
| Measurement Example I | checked (tested) directly with probe card | | |
| Measurement Example II | 50 | 15 | no |
| Measurement Example III | 10 | 6 | no |
| Measurement Example IV | 10 | 6 | yes |

TABLE 3

| Measurement Example I | | Measurement Example II | Measurement Example III | Measurement Example IV |
|---|---|---|---|---|
| 320 pads | Number of pads | 320 pads | 1,280 pads | 1,280 pads |
| ≈100% (319 pads) | Example 1 | 100% (320 pads) | 37.5% (480 pads) | 100% (1,280 pads) |
| (including poor | Example 2 | 100% (320 pads) | 37% (478 pads) | 100% (1,280 pads) |
| alignment) | Example 3 | 100% (320 pads) | 36% (470 pads) | 100% (1,280 pads) |
|  | Comp. Ex. 1 | 100% (320 pads) | 28% (360 pads) | 70% (900 pads) |
|  | Comp. Ex. 2 | 100% (320 pads) | 27% (340 pads) | 68% (875 pads) |

From the results shown in Table 3, the anisotropically conductive films of the comparative examples are fully able to exhibit their functionality when the electrode size (pad size) of the semiconductor device under test is large (Measurement Example II). However, when the linewidths on the circuit board under test are very small, numerous electrodes for which electrical conductivity could not be confirmed were found to be present (Measurement Example III). Moreover, even when the probes are optimized, because the conductive path density itself is wholly inadequate, the conductivity tests remain incomplete (Measurement Example IV).

By contrast, when the anisotropically conductive members obtained in Examples 1 to 3 according to the invention were used, the theoretical value of 37.5% predicted due to the insufficient number of probes was substantially achieved in Measurement Example III, and all of the conductors achieved complete conductivity in Measurement Example IV.

Following the conductivity tests, the electrode surfaces of the semiconductor devices under test and the circuit boards under test were examined. When the anisotropically conductive members obtained in Examples 1 to 3 of the invention were used, damage such as scratches were not observed, perhaps because the load was dispersed over numerous pads.

On the other hand, distinct scratches were noted on the electrode surfaces where conductivity was directly tested with probes in Measurement Example I.

Example 4

Aside from subjecting an electrolytically polished aluminum substrate to 12 hours of anodizing treatment in an electrolytic solution of 0.20 mol/L sulfuric acid and at a voltage of 20 V, a solution temperature of 10° C. and a solution flow velocity of 3.0 m/min instead of the above-described (B) Anodizing Treatment Step (Self-Ordering Method I), a structure (anisotropically conductive member) was produced by carrying out treatment under the same conditions as in Example 1.

In each instance, anodizing treatment was carried out using a stainless steel electrode as the cathode and using a GP0110-30R (Takasago, Ltd.) as the power supply. In addition, use was made of NeoCool BD36 (Yamato Scientific Co., Ltd.) as the cooling system, and Pairstirrer PS-100 (Tokyo Rikakikai Co., Ltd.) as the stirring and warming unit. The flow velocity of the electrolytic solution was measured using the vortex flow monitor FLM22-10PCW (As One Corporation).

Examination by FE-SEM in the same way as in Example 1 confirmed that, as also shown in Table 4 below, the bump height was 10 nm, the diameter of the conductive paths (i.e., the pad size) was 30 nm, and the thickness of the member was 100 μm. In addition, the ratio of the centerline length of the conductive paths to the thickness of the member (length/thickness) was 1.01.

Example 5

Each treatment step in Example 4 was carried out here in the same way, following which treatment was carried out in which the copper protruding from the insulating base material (anodized film) surface was covered with gold.

Specifically, the anisotropically conductive member obtained following trimming treatment in Example 4 was immersed for 15 minutes in a commercial electroless plating solution (PRECIOUSFAB) held at 50° C., thereby depositing gold onto the surface of the copper protruding from the surface of the insulating base material.

Examination by FE-SEM in the same way as in Example 4 confirmed that the protruding portions were rounded and the bump height had increased to about 20 nm. Moreover, as shown also in Table 4 below, the diameter of the conductive paths (i.e., the size of the pads) was 30 nm, and the thickness of the member was 100 μm. In addition, the ratio of the centerline length of the conductive paths to the thickness of the member (length/thickness) was 1.02.

Example 6

A structure (anisotropically conductive member) was manufactured by carrying out the preliminary anodizing and re-anodizing treatments in the above-described (B) Anodizing Treatment Step (Self-Ordering Method I) using an electrolytic solution of 0.20 mol/L oxalic acid and at a voltage of 50 V, a solution temperature of 20° C. and a solution flow velocity of 3.0 m/min, and by carrying out the above (G) trimming treatment for a period of 10 minutes, aside from which treatment was carried out under the same conditions as in Example 1.

The resulting anisotropically conductive member was examined by FE-SEM in the same way as in Example 1. As also shown in Table 4 below, the bump height was 40 nm, the conductive path diameter (i.e., the size of the pads) was 130 nm, and the thickness of the member was 90 μm. The ratio of the centerline length of the conductive paths to the thickness of the member (length/thickness) was 1.01.

The shapes of the anisotropically conductive members (films) obtained in Examples 4 to 6 of the invention are shown in Table 4 below.

Here, the degree of ordering, the period and the density were measured by the same methods as in Example 1.

ing the electrical resistance between $G_1$ and $S_1$. A larger resistance value indicates a good anisotropic conductivity. The results are shown in Tale 5.

TABLE 5

|  | Resistance of conductive elements (Ω) | Resistance of insulating portion (Ω) |
|---|---|---|
| Example 1 | 0.3 | $1.4 \times 10^9$ |
| Example 2 | 0.3 | $1.3 \times 10^9$ |
| Example 3 | 0.2 | $4.0 \times 10^9$ |
| Example 4 | 0.3 | $1.4 \times 10^9$ |
| Example 5 | 0.3 | $1.3 \times 10^9$ |
| Example 6 | 0.2 | $4.0 \times 10^9$ |
| Comparative Example 1 | 0.8 | $2.5 \times 10^4$ |
| Comparative Example 2 | 1.0 | $4.0 \times 10^3$ |

The anisotropically conductive member of the invention may be used as an inspection connector when functional inspections are carried out on electronic components such as semiconductor devices. In addition, as also illustrated in the examples described above, the anisotropically conductive member of the invention may be combined or used integrally together with a probe card, which is a semiconductor inspection device already known in the art.

Moreover, the anisotropically conductive member of the invention may also be used as an electrical interface (electronic connecting member) between the mother board of a CPU or the like and an interposer, or as an electrical interface between an interposer and a silicon wafer.

In such cases, by combining the inventive film on a substrate where signal output pads are wired instead of on a probe, use as an inspection probe is also possible.

Furthermore, by integrally uniting the anisotropically conductive member of the invention with the signal output side of a silicon wafer, electrical signals can be output without damaging the wiring structure and also, from the standpoint of the manufacturing process, without requiring very precise alignment.

The anisotropically conductive member of the invention, particularly in cases where it is used as an electronic connect-

TABLE 4

|  | Degree of ordering (%) | Period (nm) | Density (paths/mm²) | Pad size | Bump height | Thickness (μm) | Length/thickness |
|---|---|---|---|---|---|---|---|
| EX 4 | 92 | 63 | approx. 150 million | 30 nm diameter | 10 nm | 100 | 1.01 |
| EX 5 | 90 | 63 | approx. 150 million | 30 nm diameter | 20 nm | 100 | 1.02 |
| EX 6 | 95 | 200 | approx. 14 million | 130 nm diameter | 40 nm | 90 | 1.01 |

The anisotropic conductivities of the anisotropically conductive members (films) obtained in Examples 1 to 6 of the invention and Comparative Examples 1 and 2 were measured.

The conductivity in the depth direction (resistance of conductive elements) was determined as follows. A device 61 prepared by cutting the anisotropically conductive member (film) obtained in each of Examples 1 to 6 and Comparative Examples 1 and 2 to a size of 1.5×6.0 mm was placed between two electrodes 62 of the same size and composed of gold (pitch, 10 μm) as shown in FIG. 8, pressure bonded at 200° C. and 0.5 MPa for 1 minute, and the electrical resistance between $G_1$ and $G_2$ was measured. A smaller resistance value indicates a better anisotropic conductivity. The results are shown in Table 5.

In addition, the insulating properties in the planar direction (resistance of insulating portion) was determined by measuring member, may be supplied as anisotropically conductive members 73 of given dimensions attached to the outside surface of a tape (backing sheet) 72 which has been wound onto a core 71 of a given diameter and a given width in the manner of labels for displaying prices and dates on merchandise that are used in labeling devices (see FIG. 9).

Here, the dimensions of the anisotropically conductive member may be substantially the same as the dimensions of the semiconductor chips with which it is used, and the tape width may be suitably set according to the width of the anisotropically conductive member.

Because the substrate of the anisotropically conductive member is alumina, and thus difficult to subsequently cut or bend, it is desirable to set the diameter and width of the core as appropriate for the dimensions of the anisotropically conductive member. Specifically, the greater the dimension of the anisotropically conductive member in the tape length direction, the larger it is desirable to make the diameter of the core.

The material making up the tape to which the anistropically conductive members are affixed is preferably a material which does not leave adhesive on the surface of anisotropically conductive members peeled therefrom.

This manner of feeding anisotropically conductive members enables the user to peel off and use one piece of anisotropically conductive film attached to the tape at a time.

When the anisotropically conductive member of the invention is used in particular as an electronic connection member, it may be supplied from a drawer-like storage box 81 which holds vertically arranged anisotropically conductive members 82 of a given dimension.

The dimensions of the storage box may be suitably varied according to the dimensions of the anisotropically conductive members.

At the interior of the storage box, because neighboring anisotropically conductive members will otherwise come into mutual contact, it is desirable to store the anisotropically conductive films so that adjoining films do not come into direct contact, such as by inserting a cushioning material therebetween or individually packaging each anisotropically conductive film.

This manner of feeding anisotropically conductive members enables the user to take out and use one piece of the anisotropically conductive film stored in the box at a time.

When the anisotropically conductive members according to the invention are used in particular as electronic connection members, each anisotropically conductive member 92 may be furnished in a manner where it adheres to the entire surface on one side of a substantially circular plastic disk 91 of a given diameter similar to a semiconductor wafer (see FIG. 11).

Here, the diameter of the plastic disk may be set to substantially the same 5 inches or 8 inches as the diameter of the semiconductor wafer on which the anisotropically conductive film is to be used.

As in wafer level chip size packages of semiconductor chips, the anisotropically conductive member may, together with the plastic disk, have scores 93 formed therein prior to use so as to enable the member to be cut to substantially the same dimensions as the semiconductor chips on which they are to be used.

This manner of supply enables the user to take an anisotropically conductive film that has been affixed over the entire surface on one side of a plastic disk, cut and divide up the film together with the plastic disk into individual pieces along the scores, then remove the plastic and use the anisotropically conductive film.

In cases where the anisotropically conductive member of the invention is used as a connecting member between individual semiconductor chips and interposers, it may be supplied in a state where the semiconductor wafer and interposer have been connected beforehand by the anisotropically conductive film.

The anisotropically conductive member of the invention also shows promise in applications relating to light-transmitting materials.

What is claimed is:

1. A method of manufacturing an anisotropically conductive member comprising: an insulating base material; and conductive paths composed of a conductive material which pass in a mutually insulated state through the insulating base material in a thickness direction thereof and which are provided in such a way that a first end of each conductive path is exposed on a first side of the insulating base material and a second end of each conductive path is exposed on a second side of the insulating base material; wherein the conductive paths have a density of at least 2 million paths/mm$^2$ and the insulating base material is a structure composed of an anodized aluminum film having micropores therein, the method comprising, in order:

an anodizing step of anodizing an aluminum substrate so as to form the anodized film having micropores therein;

a perforating step of passing holes determined by the micropores through the anodized film so as to obtain the insulating base material; and a metal filling step of filling a metal as the conductive material into the holes which pass through the insulating base material so as to obtain said anisotropically conductive member.

2. The method of claim 1, further comprising, after the metal filling step, a surface planarizing step of planarizing a front side and a back side of the anisotropically conductive member by chemical mechanical polishing.

3. The method of claim 1, further comprising, after the metal filling step, a step of trimming the insulating base material on a surface of the anisotropically conductive member.

4. The method of claim 1,
wherein the anodizing step including anodizing treatment, film removal treatment and re-anodizing treatment in this order, and
wherein the film removal treatment dissolves the anodized film formed by the anodizing treatment.

5. The method of claim 1,
wherein the anodizing step including anodizing treatment and anodized film dissolution treatment in this order, the anodizing step being repeated at least twice,
wherein the anodized film dissolution treatment is pore widening treatment in which diameters of micropores present in the anodized film formed by the anodizing treatment, and
wherein a latest anodized film dissolution treatment dissolves interiors of the micropores on a surface side from a point of inflection of the anodized film.

* * * * *